United States Patent [19]

Maeda et al.

[11] Patent Number: 5,057,861
[45] Date of Patent: Oct. 15, 1991

[54] COLOR IMAGE RECORDER AND IMAGE PROJECTOR USEFUL THEREFOR

[75] Inventors: Kiyoshi Maeda; Sadahiko Nishide, both of Hikone; Mamoru Yoshiyama, Kyoto; Seiichi Matsuguchi, Kyoto; Masahiko Kurosaki, Kyoto; Takao Oura, Kyoto; Tetsuya Hayashi, Kyoto; Yoshikazu Kobayashi; Yoshiaki Handa, both of Tokyo, all of Japan

[73] Assignee: Dainippon Screen Mfg. Co. Ltd., Japan

[21] Appl. No.: 275,722

[22] Filed: Nov. 23, 1988

[30] Foreign Application Priority Data

Nov. 28, 1987 [JP] Japan .................................. 62-300897
Nov. 28, 1987 [JP] Japan .................................. 62-300898
Nov. 28, 1987 [JP] Japan .................................. 62-300899
Dec. 2, 1987 [JP] Japan .......................... 62-184796[U]
Dec. 2, 1987 [JP] Japan .................................. 62-306248
Dec. 2, 1987 [JP] Japan .................................. 62-306249

[51] Int. Cl.$^5$ ....................... G03B 27/52; G03B 27/60
[52] U.S. Cl. ......................................... 355/27; 355/70; 355/73; 355/100
[58] Field of Search ..................... 355/27, 28, 326, 38, 355/68, 37, 70, 67, 29, 100, 106, 72, 73, 65, 76

[56] References Cited

U.S. PATENT DOCUMENTS

| | | | |
|---|---|---|---|
| 3,682,539 | 8/1972 | Yamaji et al. | 355/70 X |
| 4,124,292 | 11/1978 | Van Wandelen | 355/70 |
| 4,681,427 | 7/1987 | Plummer | 355/37 X |
| 4,760,426 | 7/1988 | Taniguchi et al. | 355/27 |
| 4,760,609 | 7/1988 | Tamagaki | 355/37 X |
| 4,806,446 | 2/1989 | Hatta et al. | 430/211 X |
| 4,810,614 | 3/1989 | Sangyoji et al. | 430/211 X |

Primary Examiner—L. T. Hix
Assistant Examiner—D. Rutledge
Attorney, Agent, or Firm—Ostrolenk, Faber, Gerb & Soffen

[57] ABSTRACT

A photosensitive sheet (11) having photohardenable microcapsules is unrolled to be intermittently fed onto the exposure stage (300), and color separated images are projected onto a common area of the photosensitive sheet. A receiver paper (12) having a color coupler layer is overlaid on the photosensitive sheet, and pressed with a press roller mechanism (700), whereby a color image appears on the receiver paper. The receiver paper is separated from the photosensitive sheet, and thermally treated with a heater (820).

14 Claims, 22 Drawing Sheets

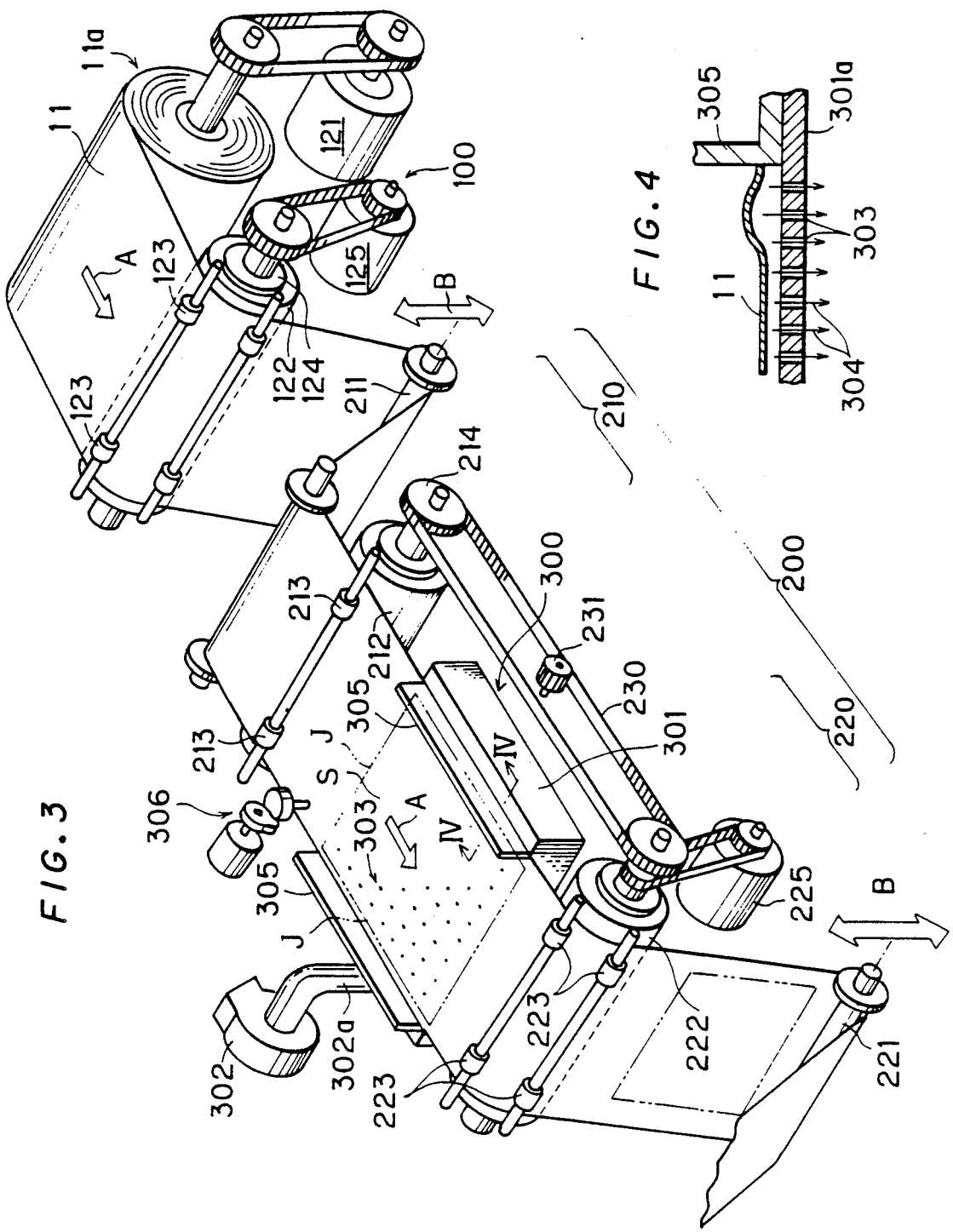

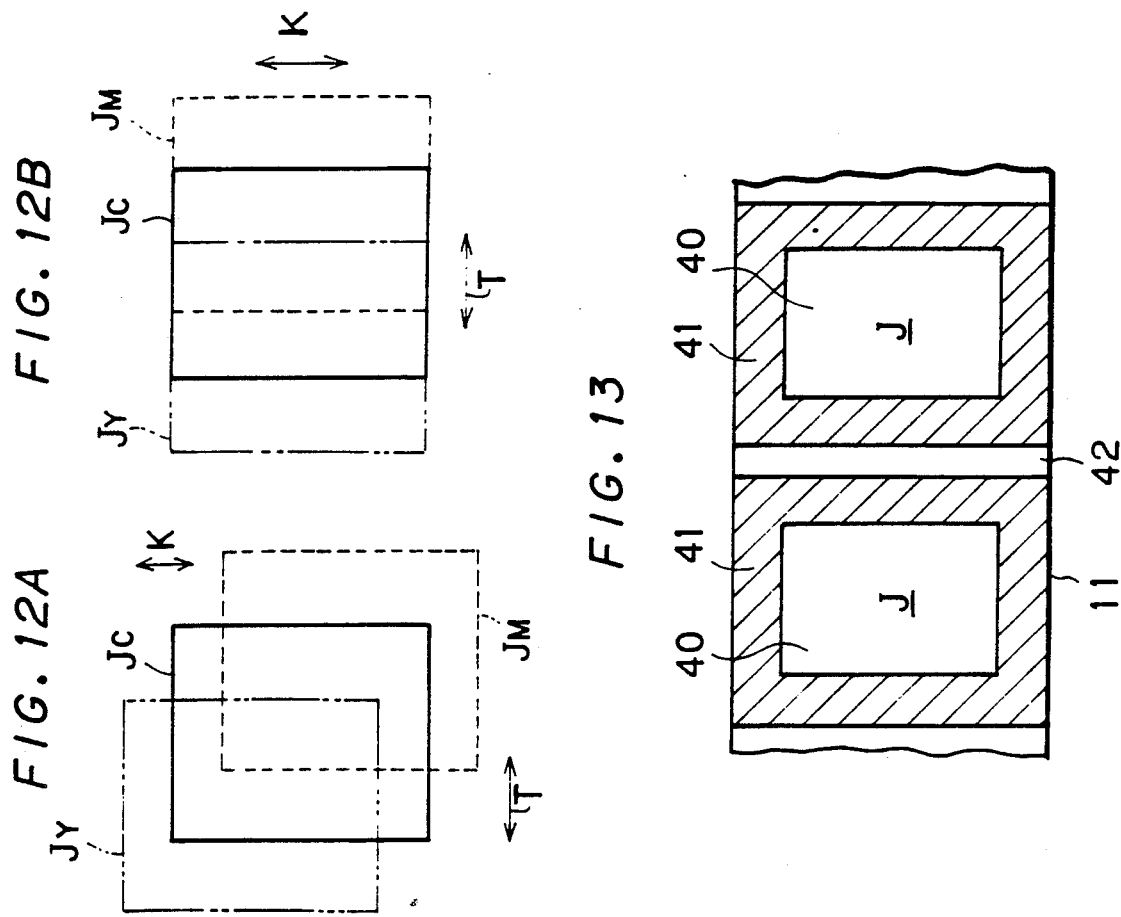
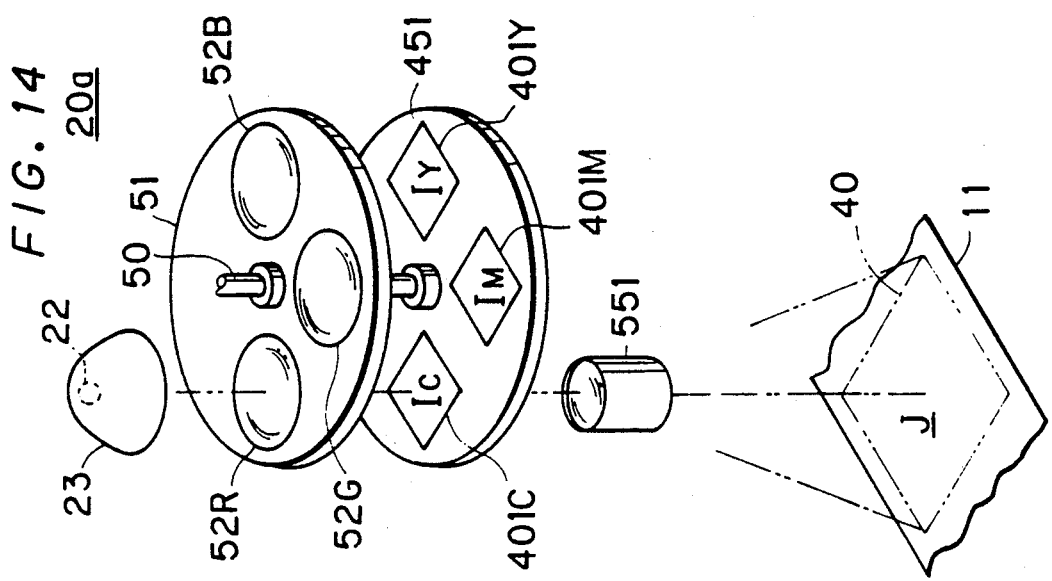

COLOR IMAGE RECORDER AND IMAGE PROJECTOR USEFUL THEREFOR

BACKGROUND OF THE INVENTION

1. Field of the Invention

The present invention relates to a color image recorder employing a photosensitive sheet on which microcapsules containing dyes are coated, and more particularly, to a color image recorder in which a long photosensitive sheet is intermittently conveyed along a process path for image recording and an image projector employed in the color image recorder.

2. Description of the Background Arts

For a long time, color image recording process has been conducted only in a printing factory, since conventional color image recorders are complicated in structure and operators skilled in the process are required.

Recently, compact color image recorders capable of being used in an office and the like have been developed. In one of the conventional compact color image recorders is so constructed that an electrostatic latent image is produced on a photosensitive drum, and color toners electrostatically adsorbed on the latent image are transferred to a record paper. The color image recorder, however, has a disadvantage in that the color toners are often scattered to a pheripheral mechanism as dusts.

Another conventional recorder is that of termal transfer type, in which respective color inks applied on films are thermally transferred to a record sheet. The termal transfer process should be carried out for each color ink film, and therefore, the image recording cannot be conducted at a high speed.

In order to overcome the disadvantages, a photosensitive sheet on which photohardenable microcapsules containing dyes are coated has been invented, as disclosed in "The Mead Microencapsulated Imaging System" SPSE 23rd Fall Synposium on Microimaging Technology, Nov. 15, 1983. The photosensitive sheet having the microcapsules thereon should be carefully handled, since the microcapsules are often destroyed through rough handling. Therefore, it is desired to develop a color image recorder suitable for the image recording with the photosensitive sheet. Furthermore, an image projector and other mechanisms required in the color image recorder should be so constructed that the image recording process can be conducted at a high speed and a high accuracy.

SUMMARY OF THE INVENTION

The present invention is intended for a color image recorder for recording a color image on a receiver paper through a photosensitive sheet, the color image recorder having a path along which the photosensitive sheet is conveyed.

According to the present invention, the color image recorder comprises a photosensitive sheet feeder for feeding a photosensitive sheet to the exterior of the photosensitive sheet feeder, wherein the photosensitive sheet has a photosensitive surface layer in which a number of photohardenable microcapsules are distributed, and the microcapsules are classified into a plurality of microcapsule groups including different color dyes, respectively.

The photosensitive sheet is received by stage means provided at a down stream side of the photosensitive sheet feeder along the path.

Image projection means provided at a position facing the stage means projects a plurality of color separated image lights onto a common area of the photosensitive sheet existing on the stage means, whereby the microcapsules are selectively exposed to and photohardened with the color separated image lights.

The color image recorder further comprises loading means provided between the photosensitive sheet feeder and the stage means for loading the photosensitive sheet fed from the photosensitive sheet feeder onto the stage means, and unloading means provided in a downstream side of the stage means along the path, for unloading the photosensitive sheet from the stage means.

A receiver paper feeder provided at a downstream side of the unloading means along the path, feeds a receiver paper onto the common area of the photosensitive sheet unloaded from the stage means, wherein the receiver paper has an active surface layer including a color coupler, and the receiver paper is so fed onto the photosensitive sheet that the photosensitive surface layer and the active surface layer contact each other.

Press means provided in a downstream the of the receiver paper feeder along the path, receives the photosensitive sheet on which the receiver paper is placed, to press the photosensitive sheet and the receiver paper to each other, whereby the microcapsules not photohardened with the color separated image lights are destroyed, and the color dyes going out for destroyed microcapsules are coupled with the color coupler to form a color image on the receiver paper.

The receiver paper is then separated from the photosensitive sheet by separation means provided at a downstream side of the press means along the path.

According to a preferred embodiment of the present invention, the photosensitive sheet is a continuous long sheet prepared as a roll, and the photosensitive sheet feeder includes unrolling means for unrolling the roll, to intermittently feed an unrolled part of the photosensitive sheet to the stage means through the loading means.

Preferably, the stage means comprises negative pressure generating means provided between the loading means and the unloading means and having a stage surface facing the photosensitive sheet with a predetermined gap between, for generating a negative pressure in the gap.

In an aspect of the present invention, an image projector for projecting color separated images on a common area of a projection plane comprises: (1) a color light generator for generating a plurality of color lights, (2) an original holder provided between the color light generator and the projection plane for holding original plate means on which the color separated images are previously recorded, to receive the color lights with the original plate means, and (3) a lens unit provided between the original holder and the projection plane for projecting the color lights having passed through the original plate means, on to the common area.

The lens unit may have (2-1) a plurality of lens whose number is the same with the color separated images, and (2-2) a lens holder for holding the plurality of the lens so that an off-axis projection condition is satisfied in all of the lens, where the off-axis projection condition is defined as a condition that a line connecting a center point of a color separated image on the original plate means and a center point of the common area of the plane cross an optical axis of a corresponding lens at the inside of the corresponding lens at a center of the corresponding lens.

In another aspect of the present invention, a lens unit employable in image projection comprises (1) a first projection lens (2) a first block member in which the first projection lens is mounted, (3) a second projection lens, and (4) a second block member in which the second projection lens is mounted through an eccentric ring rotatably provided in the second block member, the first and second block members being interconnected so that respective optical axes of the first and second projection lens are arrayed in parallel to each other, and the second block member is movable in a predetermined direction perpendicular to the optical axes.

The first projection lens may be mounted is the first block member through an eccentric ring rotatably provided in the first block member.

In the preferred embodiment, the lens unit further comprises (5) a third projection lens, and (6) a third block member in which the third projection lens is mounted through an eccentric ring rotatably provided in the third block member, the first through third block members being interconnected so that respective optical axes of the first through third projection lens are arrayed in parallel to each other, and the third second block member is movable in the predetermined direction.

In further another aspect of the present invention, a mechanism for feeding a photosensitive sheet along a predetermined path while supporting the photosensitive sheet, comprises (1) a first roller provided at an upstream side of the path for fetching the photosensitive sheet from the exterior of the mechanism, a circumferential surface of the first roller being rotated at a first speed, (2) a second roller provided at a downstream side of the path for receiving the photosensitive sheet from the first roller, wherein a distance between the first and second rollers is shorter than a length of the photosensitive sheet so that the photosensitive sheet is supported with the first and second rollers, and a circumferential surface of the second roller is rotated at a second speed faster than the first speed, and (3) negative pressure generating means provided between the first and second rollers and having a surface facing the photosensitive sheet with a predetermined gap between, for generating a negative pressure in the gap.

The present invention also provides a press roller mechanism suitable for the image transfer from the photosensitive sheet to the receiver paper. The original plate is prepared in an original plate exposure unit. Especially, a work table feeder for feeding a work table is improved in the original plate exposure unit.

According to the present invention, a pass roller mechanism for pressing a sheet member being conveyed along a predetermined path, comprises (1) a first roller provided at an upstream side of the path, (2) a second roller provided at a downstream side of the path, wherein an axis of the second roller is parallel to an axis of the first roller, and is apart from the first roller with a predetermined gap between, (3) morter means for driving at least one of the first and second roller, (4) a third roller provided on the first and second rollers so as to contact both of the first and second rollers, wherein an axis of the third roller is parallel to the respective axes of the first and second rollers, a diameter of the third roller is larger than respective diameters of the first and second rollers and the third roller is made of an erastic material, and (5) push means provided on the third roller for pushing the third roller toward the gap so that a circumferential shape of the third roller is deformed, wherein a sheet member passes through a boundary between the first and third rollers while being pressed with the first and third rollers and then passes through a boundary between the second and third rollers while being pressed with the second and third rollers.

The work table feeder having a screw feeding mechanism coupled to a motor, for feeding a work table by the screw feeding mechanism in a predetermined feeding direction, comprises (1) a base member, (2) a slide tabe provided on the base member and being slidable in the feeding direction (3) a motor mounted on the slide table, and (4) a screw feeding mechanism coupled to the motor for feeding the work table in the feeding direction.

In the present invention, "an original plate" means not only a hard plate but also a soft plate such as a film. Further more, "photosensitive sheet" means a continuous long sheet as well as a separated sheet.

Accordingly, an object of the present invention is to provide a color image recorder in which a color image can be systematically obtained on a receiver paper through a photosensitive sheet.

Another object of the present invention is to provide a color image recorder suitable for intermittent feeding of the photosensitive sheet.

Further another object is to provide an color image projector in which a time required for exposing the photosensitive sheet with a plurality of color separated image lights is reduced.

Further another object is to improve a mechanism for adjusting respective positions of a plurality of lens, which is required for projecting the color separated images onto a common area of the photosensitive sheet.

It is still another object of the present invention to provide an exposure stage on which the photosensitive sheet is placed to be exposed with the color separated image lights, without a crinkle in the photosensitive sheet.

It is further another object of the present invention to provide a mechanism for smoothly conveying the photosensitive sheet through the exposure table without lateral fluctuation of the photosensitive sheet.

Further another object of the present invention is to provide press roller mechanism in which rollers are not skewed even if a high pressure is applied.

Further another object is to decrease a pushing force to be applied the press roller mechanism.

It is still further object of the present invention to provide a press mechanism by which an uniform pressure can be applied to the photosensitive sheet and the receiver paper.

Yet another object of the present invention is to provide a work table feeder capable of feeding a work tabe at a high accuracy, without a closed loop control circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is an enlarged view of a conveyer mechanism and an exposure stage, FIG. 4 is a partial cross section of the exposure stage.

FIG. 12A and FIG. 12B are diagrams showing a process of adjusting opitcal elements, FIG. 13 is a diagram showing an arrangement of exposure areas on a photosensitive sheet, FIG. 14 shows an image projector which can be employed in the present invention in place of an image projector shown in FIG. 2A.

DESCRIPTION OF THE PREFERRED EMBODIMENTS

Figure 1:
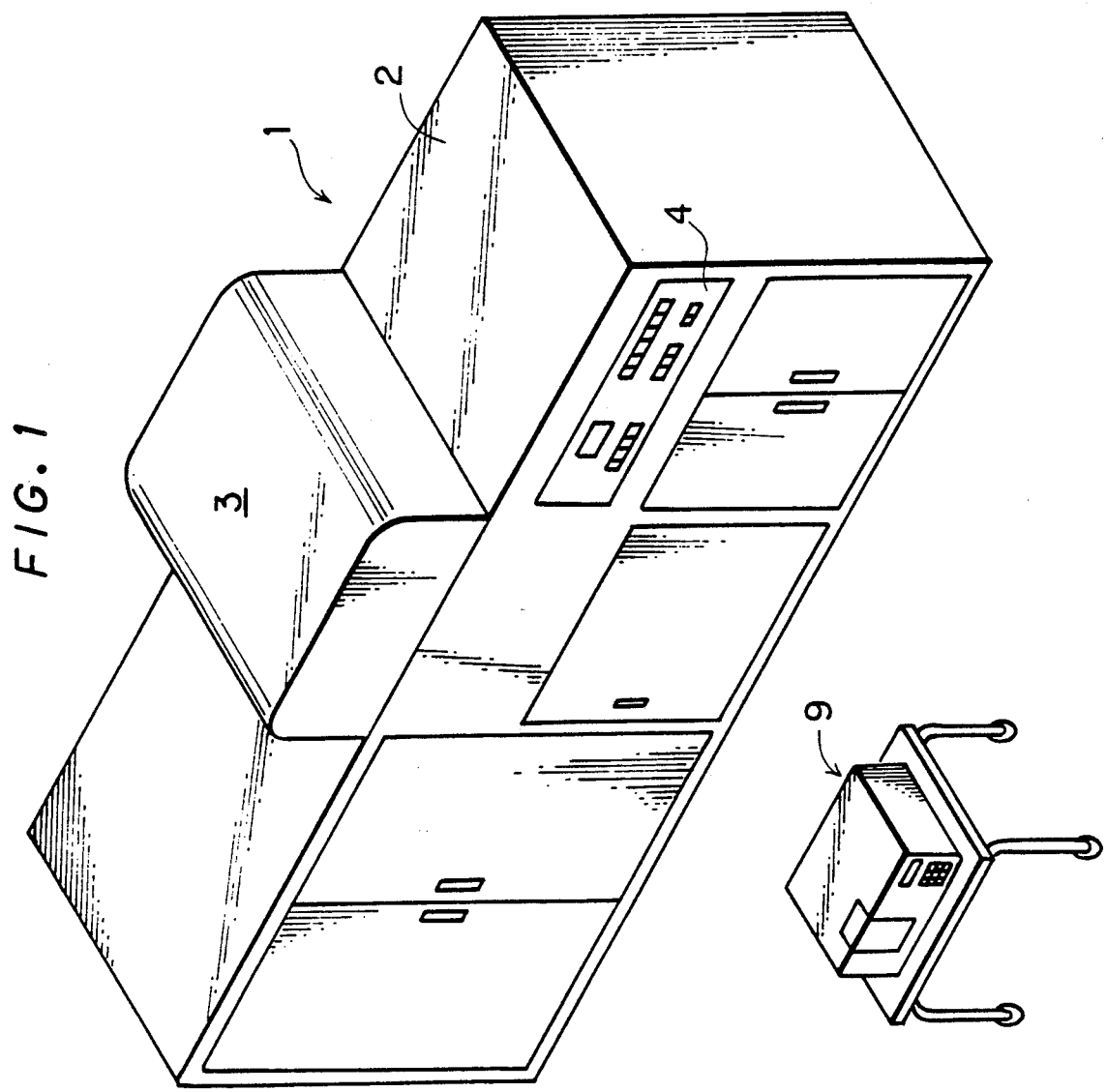
FIG. 1 is a perspective view of a color image recording system according to a preferred embodiment of the present invention, FIG. 2A and FIG. 2B as combined with each other show the internal structure of a color image recorder.

FIG. 1 is a perspective view of a color image recording system according to a preferred embodiment of the present invention. The system comprises a color image recorder 1 and an original plate exposure unit 9 provided for preparing original plates to be employed in the color image recorder 1. The color image recorder 1 has a body box 2 in which a color image recording mechanism is contained. An image projector, which will be described later, is mounted in a convex head 3, and an operation panel 4 is provided on the front wall of the body box 1.

A. Internal Structure and Operation of Color Image Recorder 1

(1) Overall Structure and Operation

Figure 2A:
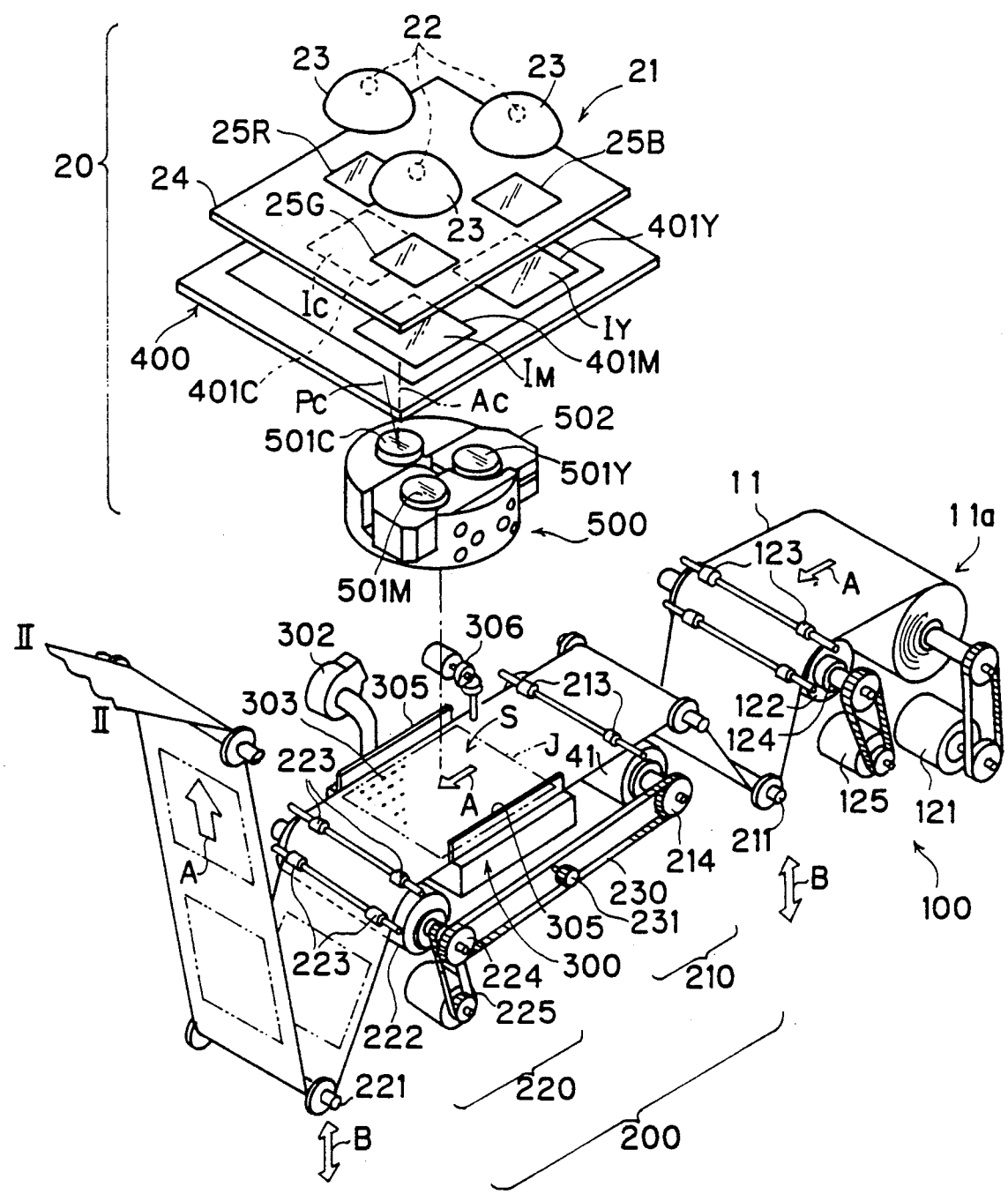
Figure 2B:
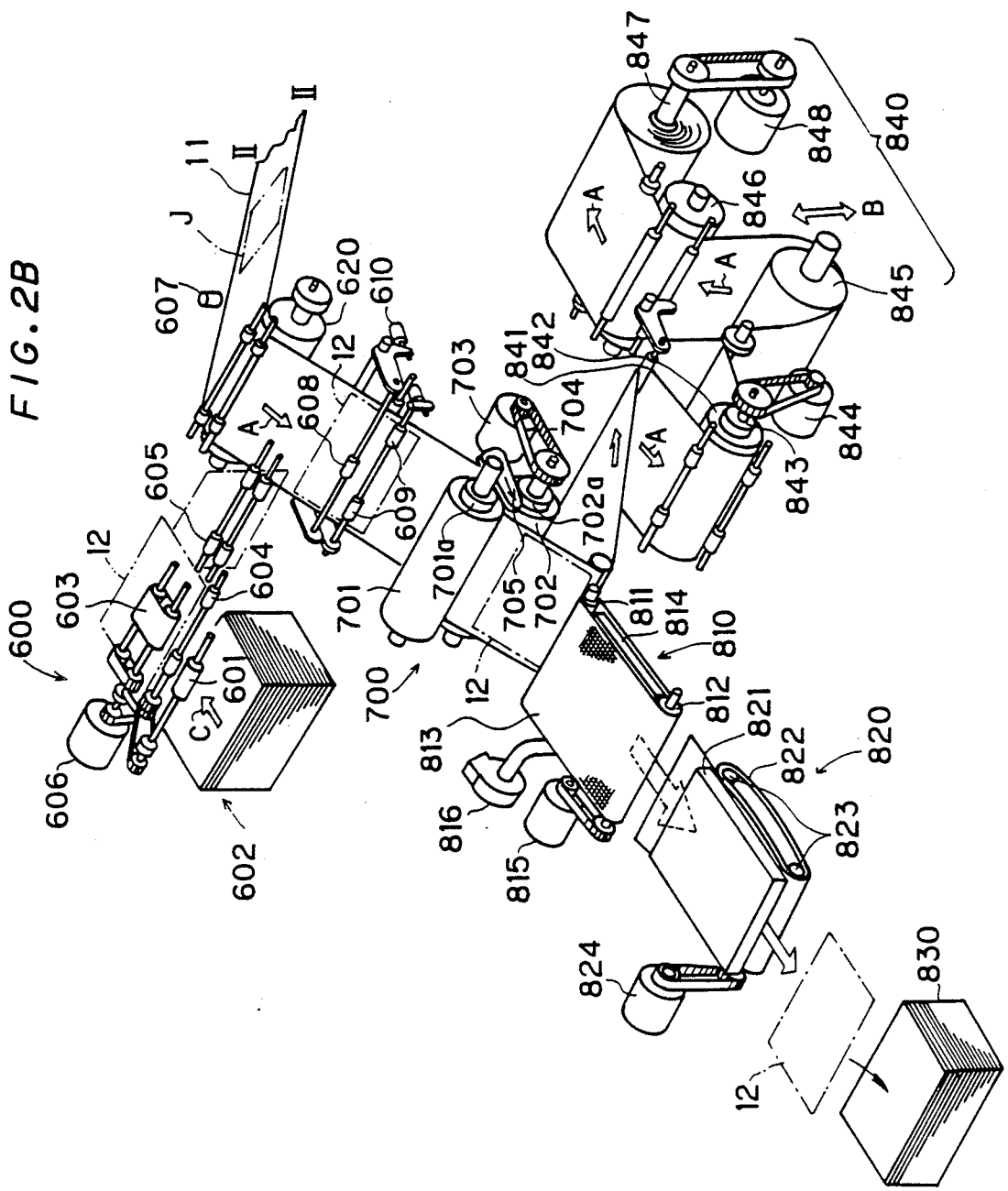

FIG. 2A and FIG. 2B as combined with each other show the internal structure of the color image recoder 1, where the cut end II—II in FIG. 2A continues to that in FIG. 2B. A continuous long photosensitive sheet 11 is provided in a photosensitive sheet feeder 100 as a roll 11a. The photosensitive sheet 11 is unrolled to be fed to an exposure stage 300, and then exposed with imaging lights supplied from an image projector 20. The photosensitive sheet 11 is then conveyed to a position under a receiver paper feeder 600, where a receiver sheet or a receiver paper 12 is fed to the photosensitive sheet 11 to be overlaid thereon. The photosensitive sheet 11 and the receiver paper 12 are pressed to each other in a press or impress mechanism 700. As will be described later in detail, a color image appears in the surface of the receiver paper 12 through the press.

Then, the photosensitive sheet 11 and the receiver paper 12 are separated from each other by a separator 810. After the separation, the photosensitive sheet 11 is rolled in a rolling mechanism 840, while the receiver paper 12 is subjected to a heat treatment in a heater 820 of oven type.

Through the above indicated process, a desired image is recorded on the receiver paper 12. In FIG. 2A and 2B, the moving path or direction of the photosensitive sheet 11 is indicated by the arrow "A".

Details of respective parts of the color image recorder is as follows:

(2) Photosensitive Sheet 11 and Receiver Paper 12

The photosensitive sheet 11 has a long support film and a photosensitive surface layer formed by coating a number of microcapsules on the support film. Liquid dyes capable of being developed with color coupler into yellow, magenta and cyan, respectively, are individually contained in the microcapsules. The microcapsules are made of a radiation-durable or photohardenable composition. More particularly, microcapsules containing yellow, magenta and cyan dyes are photohardenable for red, green and blue lights, respectively. On the other hand, each of the receiver papers 12 has an active surface layer including the color coupler. The photosensitive sheet 11 and the receiver paper 12 can be obtained from The Mead Corporation, Dayton, Ohio, U.S.A.

(3) Photosensitive Sheet Feeder 100

The photosensitive sheet feeder 100 shown in FIG. 2A has an unrolling motor 121 for rotating the roll 11a of the continuous long photosensitive sheet 11 to unroll the sheet 11. A feeding motor 125 is coupled to a feeding roller 122 through a belt transmission and a torque limiter 124. The torque limiter 124 is operable to limit the tension applied to the photosensitive sheet 11 through the roller 122, to a predetermined low value. Feeding force for the photosensitive sheet 11 is generated with the feeding motor 125, and the rotation of the unrolling motor 121 is synchronized with that of the feeding motor 125. Since the torque limitter 124 is provided, high tension is not applied to the photosensitive sheet 11, so that the microcapsules on the sheet 11 are prevented from being destroyed.

Holding rollers 123 are provided on the feeding roller 122 so that the photosensitive sheet 11 is held between the feeding roller 124 and the holding rollers 123 following the feeding roller 124. The holding rollers 123 exist on the end areas of the feeding roller 122, and therefore, the microcapsules provided on the central area of the photosensitive sheet 11, on which an image is to be recorded in the following process steps, are not destroyed with the pressure applied from the holding rollers 123.

The photosensitive sheet 11 is intermittently unrolled and fed to a conveyer mechanism 200 provided in the downstream side of the feeder 100.

(4) Conveyer Mechanism 200 and Exposure Stage 300

The conveyer mechanism 200 has a loading mechanism 210 for loading the photosensitive sheet 11 on the exposure stage 300, and an unloading mechanism 220 for unloading the sheet 11 from the stage 300. The loading mechanism 210 and the unloading mechanism 220 are provided in the upstream and downstream sides of the exposure stage 300, respectively.

FIG. 3 is an enlarged view of the conveyer mechanism 200 and the exposure stage 300. Dancer rollers 211 and 221 are placed on the photosensitive sheet 11 at the upstream and downstream end sides of the conveyer mechanism 200, respectively. The dancer roller 211 and 212 are movable in the vertical direction B under the balance of the their weights and the tension applied to the sheet 11, to function as front and rear buffers for buffering the tension applied to the sheet 11 in the intermittent conveyance of the sheet 11. Therefore, the sheet can be intermittently conveyed to and from the exposure stage 300 without destruction nor a crinkle thereof.

The loading mechanism 210 comprises a combination of a front roller 212 and a holding roller 213 for loading the sheet 11 to the exposure stage 300 while holding the sheet 11 therebetween. Similarly, the unloading mechanism 220 has a combination of a rear roller 222 and holding rollers 223 for unloading the sheet 11 from the exposure stage 300. The respective axes of the rollers 212 and 222 are connected to toothed pulleys 214 and 224, respectively, around which a timing belt 230 is provided. A constant tension is applied to the timing belt 230 by a tension pulley 231. The axis of the rear roller 222 is coupled to a motor 225 provided for driving the rear roller 222. When the motor 225 is enabled to drive the rear roller 222, the front and rear rollers 212 and 222 rotate in synchronism with each other through the timing belt 230. The holding rollers 213 and 223 rotate while following the front and rear rollers 212 and 222, respectively.

The diameter of the rear roller 222 is so designed as to be somewhat larger than that of the front roller 212, and their respective rotation cycles are identical with each other. Therefore, the rotational speed of the rear roller 222 at the circumferential surface thereof is higher than that of the front roller 212, whereby the sheet 11 is strained between the rollers 212 and 222. Further, the respective upper circumferential surfaces of the the rollers 212 and 222 are somewhat higher than the upper plate surface S of the exposure stage 300. In other words, the sheet 11 is conveyed along the exposure stage 300 while floating in the air on the exposure stage 300.

The exposure stage 300 has a hollow body box 301, with which an exhaust blower 302 is connected and communicated through an exhaust pipe 302a. A large number of small suction holes 303 is formed in the upper plate of the body box 301. The suction holes 303 may be arrayed on the body box 301 at regular intervals, or they may be distributed at random. The exhaust blower 302 sucks and exhausts the air existing in the inner space of the body box 301, whereby the air existing in the gap between the sheet 11 and the body box 301 is sucked through the suction holes 303, as indicated with arrows 304 in FIG. 4 which is a cross section taken along line IV—IV in FIG. 3. A negative pressure or an attractive force due to the air suction is applied to the sheet 11 toward the body box 301, and the attractive force prevents the sheet 11 from being crinkled during the sheet 11 is conveyed. On the other hand, when the conveyance of the sheet 11 is paused for exposure thereof, the sheet 11 is somewhat loosened between the rollers 212 and 222, and is pulled down toward the body box 301 by the attractive force due to the air suction. Since the suction force is continuously applied to the sheet 11, the sheet 11 is held on the body box 301 while contacting the upper surface of the body box 301. When the rollers 212 and 222 resume their respective rotations for conveyance of the sheet 11, a tension toward the downstream side is again applied to the sheet 11, whereby the sheet 11 is raised up to the conveyance path, which is somewhat higher than the body box 301, to be conveyed along the conveyance path.

On the upper plate of the body box 301, a pair of guide plates 305 extending along the conveyance path in the both sides of the upper plate is provided in the upward direction, to guide the sheet 11. The interval between the guide plates 305 substantially equal to or somewhat larger than the width of the sheet 11, and the sheet 11 is conveyed along the path regulated between the guide plates 305. When the sheet 11 being conveyed is fluctuated in the traverse direction, the sheet 11 meets the guide plate 305. Since the sheet 11 has an intrinsic elasticity, the side edge portion thereof is bent as shown in FIG. 4, and the sheet 11 is forced back to the regular conveyance path with the elastic force in the edge portion thereof. Therefore, the guide plates 305 substantially prevents the sheet 11 from meandering or fluctuating with a large amplitude.

In order to punch a hole in the edge portion of the sheet 11, a puncher 306 is provided on a position between the holding roller 213 and the exposure stage 300. The hole is punched every time the sheet 11 is paused and the hole is referred when the receiver paper 12 shown in FIG. 2B is overlaid on the photosensitive sheet 11 in the later process step, thereby to regulate the overlaying position of the receiver paper 12 on the photosensitive sheet 11.

(5) Image Projector 20

Above the exposure stage 300, the image projector 20 shown FIG. 2A is provided. The image projector 20 comprising a color light generator 21 for generating blue, green and red lights. An original holder 400 and a lens unit 500 are arranged in series under the color light generator 21. The original holder 400 is suitable for holding original plates 201Y, 201M and 201C on which color separated images for yellow, magenta and cyan components of an original color image are previously recorded, respectively. The lens unit 500 has a set of projection lens 501Y, 501M and 501C, and a lens holder 502 for holding the projection lens 501Y, 501M and 501C.

Details of these elements is as follows:

(5-1) Color Light Generator 21

The color light generator 21 is provided with light sources 22, and reflection mirrors 23 partially covering the light sources 22 with a predetermined interspace, respectively. The light sources 22 are arranged at the apexes of an equilateral triangle, respectively. The reflection mirrors 23 are parabolic mirrors for converting the lights emitted from the light sources 22 into parallel lights.

Under the light sources 22, a filter holder 24 holding a blue filter 25B, a green filter 25G and a red filter 25R is provided. The filters 25G, 25G and 25R are arranged at the apexes of an equilateral triangle, respectively, and the lights after having penetrated through the filters 25B, 25G and 25R become color lights of blue, green and red, which propagate toward the original holder 400.

(5-2) Original Holder 400

Figure 5:
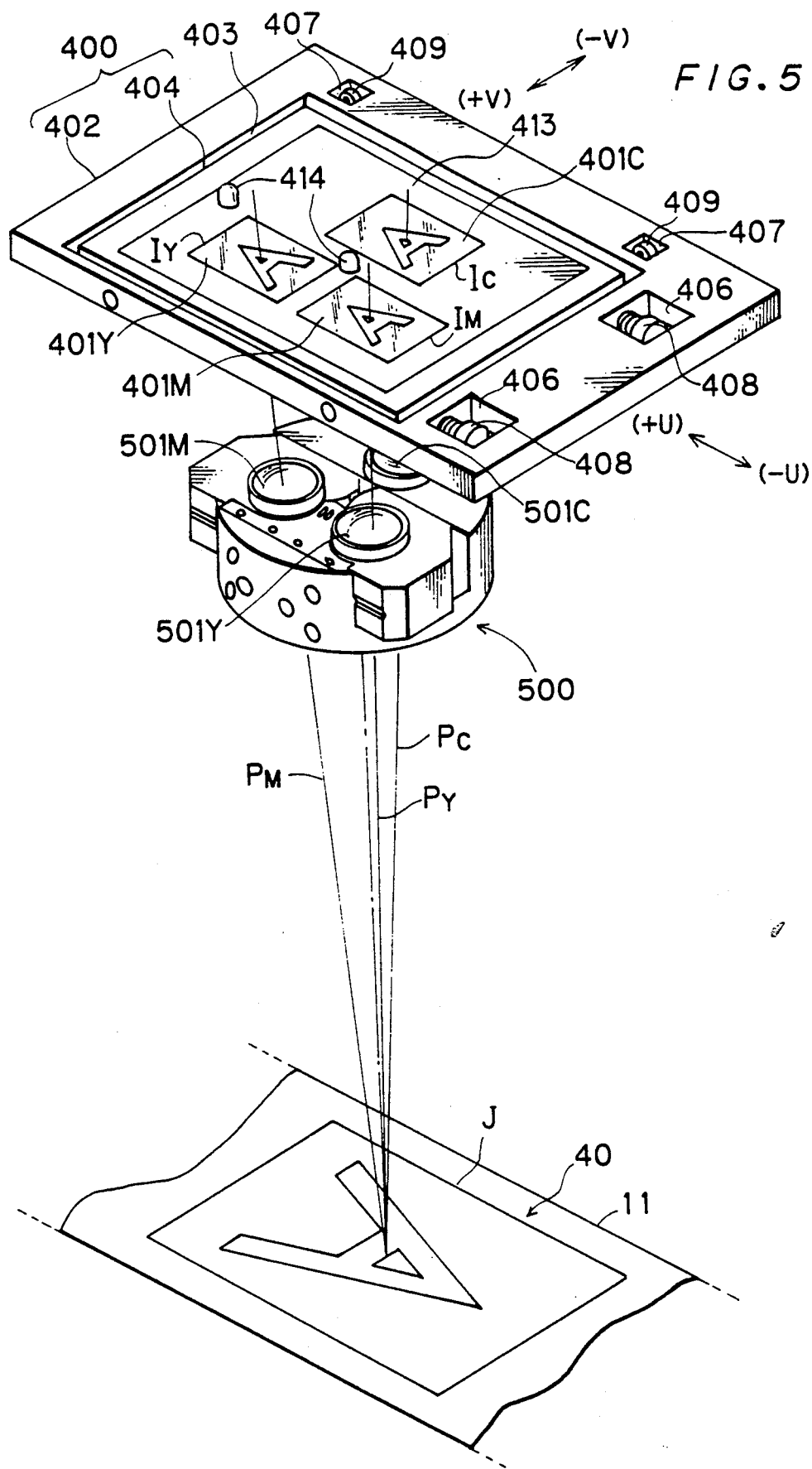
FIG. 5 is a perspective view of an original holder and a lens unit.
Figure 6:
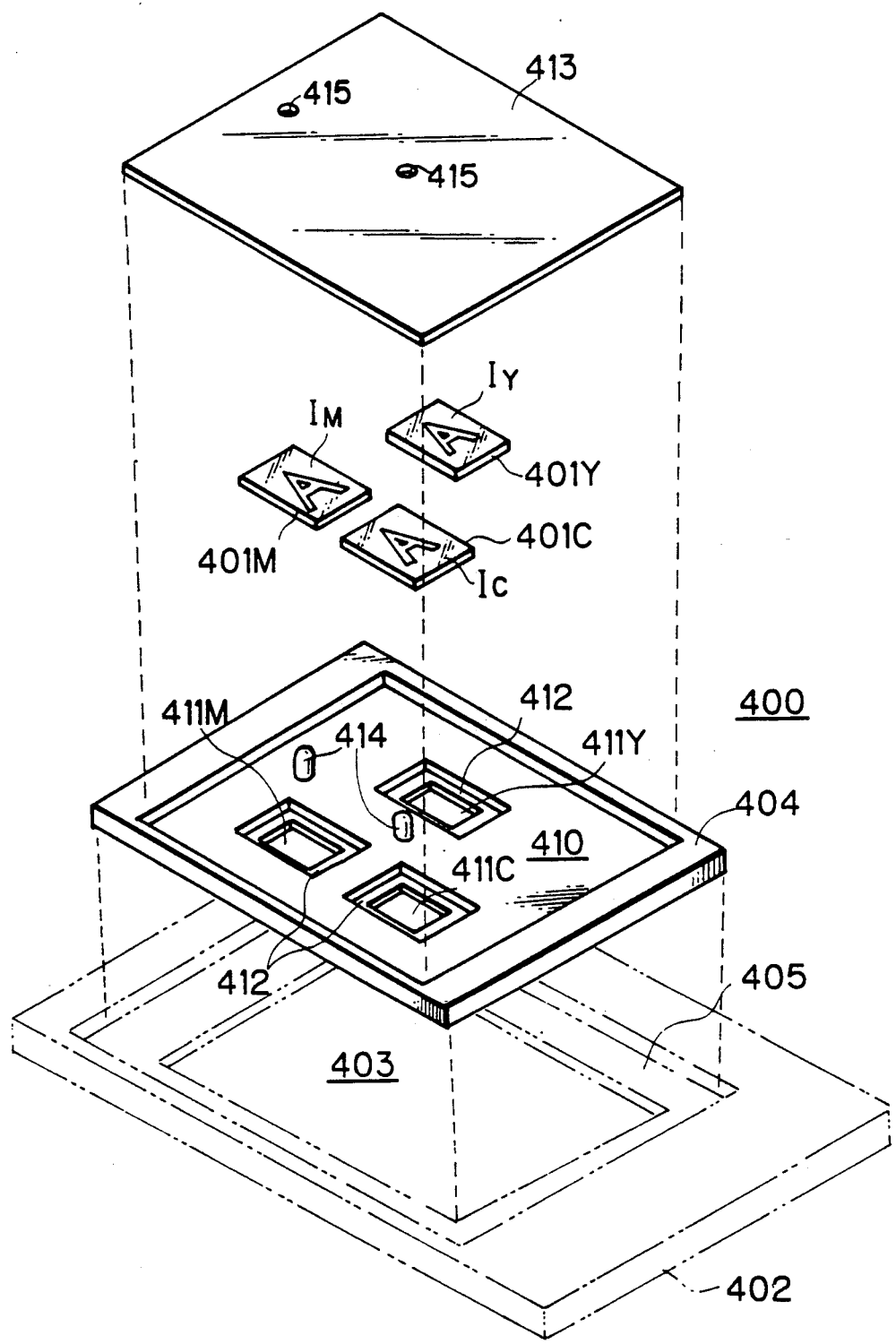
FIG. 6 is an exploded view of the original holder.

FIG. 5 is a perspective view of the original holder 400 and the lens unit 500, and FIG. 6 is an exploded view of the lens holder 400. Referring to FIG. 5 and FIG. 6, the original holder 400 has a flame member 402 in which a window 403 is opened, and a plate member 404 inserted in the window 403. The size of the plate member 404 is smaller than that of the window 403, and a step edge 405 is formed along the inner edge of the window 403. Accordingly, the plate member 404 is held with the flame member 402, and is movable within the window 403 while being supported by the step edge 405.

As shown in FIG. 5 small square holes 406 and 407 are formed in the edge portions of the flame member 402, and screws 408 and 409 are provided therein, respectively. The screws 408, 409 are inserted in screw holes (not shown) formed through the walls separating the holes 406, 407 and the window 403. When the screws 406 are rotated in the clockwise direction, the respective ends of the screws 406 push the plate member 404, to move the plate member 404 in the (+U) direction. On the other hand, when the screws 406 are rotated in the counterclockwise direction, the plate member 404 is pushed back to the direction (−U) by the elestic force of a flat spring (not shown) provided on the window edge opposite to the screws 406. Similarly, when the other screws 407 are rotated, the plate member 404 moves in the direction of (+V) or (−V). Furthermore, if the screws 406 and/or 407 are rotated by different amounts, the plate member 404 rotates in the plane defined by the window 408. In other words, the position and direction of the plate member 404 can be varied or adjusted within the window 403 by rotating the screws 408 and/or 409.

Referring to FIG. 6, the plate member 404 has a concave floor 410 in which three squre windows 411Y, 411M and 411C are formed. The square windows 411Y, 411M and 411C are arranged at the apexes of an equilateral triangle, and step edges 412 are formed therein.

Each of the original plates 401Y, 401M and 401C is liquid crystal image plate or panel formed by sandwitching transparent liquid crystal with glass plates. The color separated positive images of yellow $I_Y$, magenta $I_M$ and cyan $I_C$ are previously recorded on the original plates 401Y, 401M and 401C by scanning each of the original plates with a laser beam having a characteristic wavelength, respectively, where parts of the liquid crystal exposed to the laser beam is changed to an opaque phase. The process of preparing the original plates 401Y, 401M and 401C using the original plate exposure unit 9 (FIG. 1) will be described later. In the drawings, the image of the character "A" is illustrated on the original plates, as an example of the image to be recorded.

The original plates 401Y, 401M and 401C are inserted into the squre windows 411Y, 411M and 411C, respectively, and are supported by the step edges 412. A cover glass plate 413 is then placed in the window 403 to cover the original plates 401Y, 401M and 401C. In order to fix the position of the cover glass in the window 403, through holes 415 are formed in the cover glass plate 413, and pins 414 capable of fitting into the through holes 415 are provided on the floor 410. The flame member 404, the plate member 404, the original plate 401Y, 401M and 401C and the cover glass plate 413 can be separated from each other for setting or replace of original plates.

Figure 7:
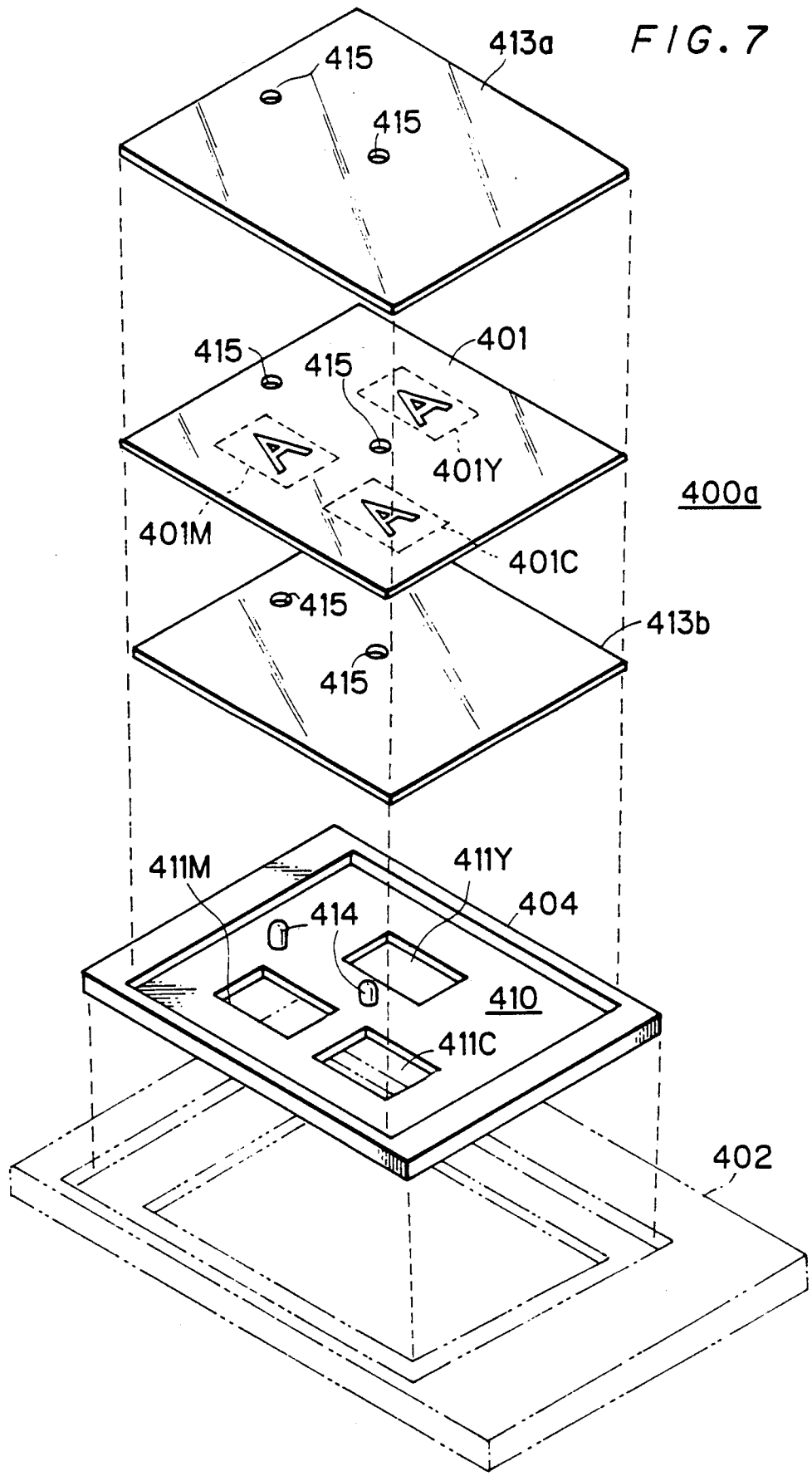
FIG. 7 is an exploded view showing another example of the original holder.

FIG. 7 is an exploded diagram showing another example of the original holder 400a. The original holder 400a is suitable for a single original plate 401 in which the color separated images $I_Y$, $I_M$ and $I_C$ are recorded. The original plate 401 is sandwitched with glass plates 413a and 413b, and placed on the floor 410 in the plate member 404. In order to prevent the combination of the elements 413a, 401 and 413b from sliding on the floor 410, through hole 415 and pins 414 are provided, similarly to the structure shown in FIG. 6.

Although each of the original plates 410Y, 401C and 401 is constructed as a transparent plate having liquid crystal, a conventional silver halide film may be employed in place of the liquid crystal plate.

(5-3) Lens Unit 500

Figure 8:
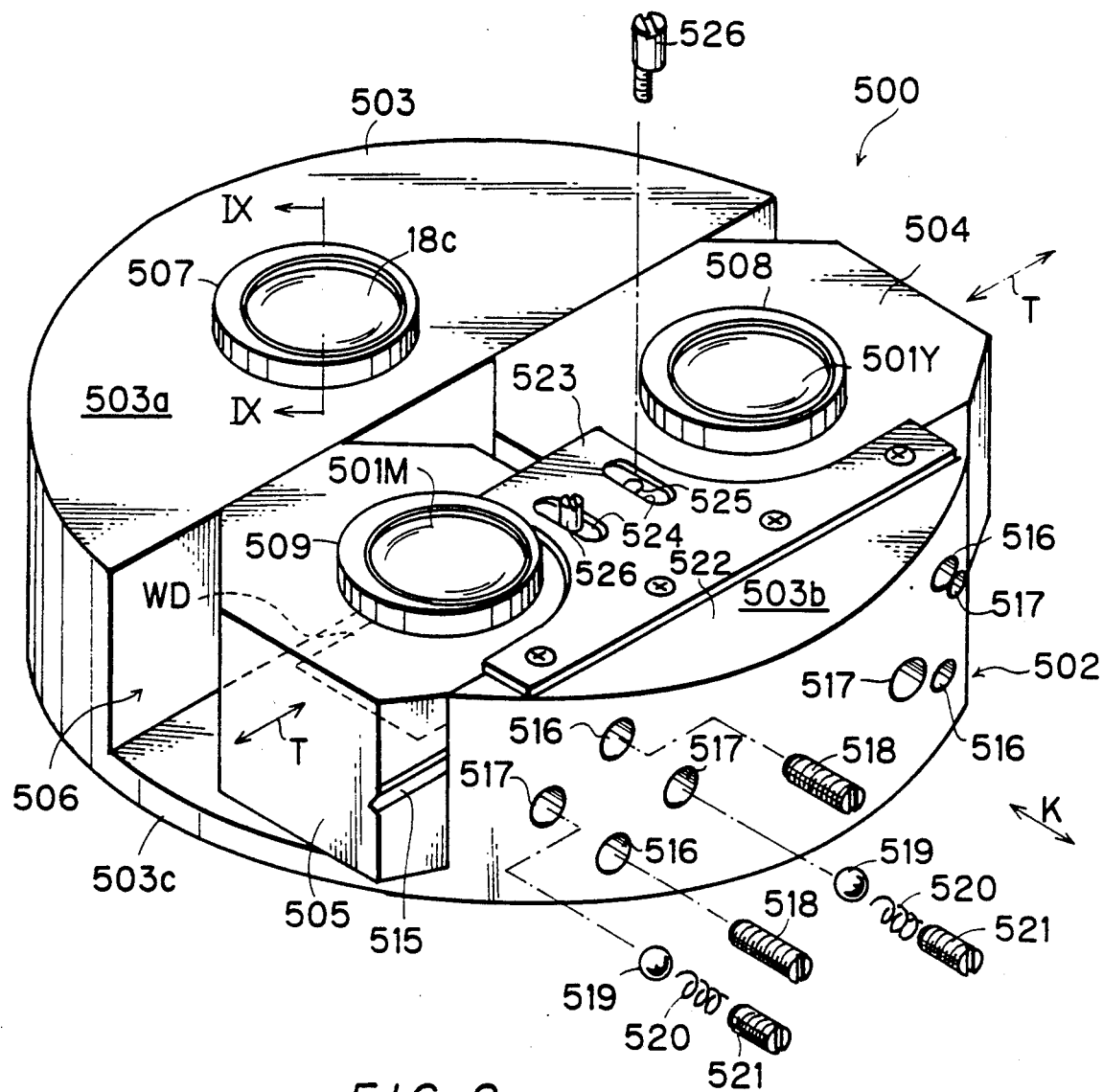
FIG. 8 is an enlarged perspective view of the lens unit.
Figure 9:
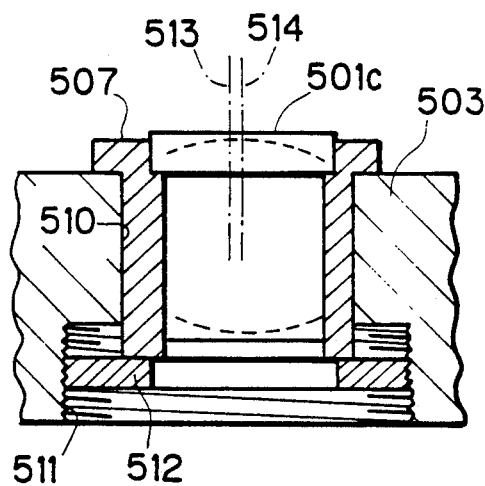
FIG. 9 is a cross section taken along line IX—IX in FIG. 8.

FIG. 8 is an enlarged perspective view of the lens unit 500, and FIG. 9 is a cross section taken along line IX—IX in FIG. 8. The lens unit 500 comprises the three sets of projection lens 501Y, 501M and 501C having a common forcal distance and a common magnitude, and the lens holder 502 holding the lens 501Y, 501M and 501C. The respective optical axes of the lens 501Y, 501M and 501C are arrayed in parallel to each other. The lens holder 502 is constructed as a combination of a reference block 503 and movable blocks 504 and 505. The reference block 503 has a shape of flat column having a straight channel 506 therein. The lens 501C for projecting the cyan image onto the photosensitive sheet 11 is mounted in the reference block 503 through an eccentric ring 507.

As shown in FIG. 9, the eccentric ring 507 is inserted in a hole 510 provided in the reference block 503. The hole 510 opens into a screw hole 511 whose diameter is larger than that of the hole 510. A ring screw 512 is screwed into the screw hole 510, to support the eccentric ring 507.

When the ring screws 512 is rotated, the height of the eccentric ring 507 is changed. Accordingly, the height of the lens 501C is increased or decreased, and the imaging magnitude of the lens 501C is also changed, since the ratio of the distance between the original plate 401C and the lens 501C and that between the lens 501C and the photosensitive sheet 11 is changed.

The eccentric ring 507 can be rotated in the hole 510 around its axis 513 while holding the lens 501C. The lens 501C fixed to the eccentric ring 507 is also rotated around the ring axis 513 according to the rotation of the ring 507. Since the rotation axis 513 is displaced from the optical axis 514 of the lens 501C, the optical axis 514 rotates around the rotation axis 513 with the rotation of the eccentric ring 507. In other words, the optical axis 514 can be moved in the circumferential direction of the optical axis 514 by rotating the eccentric ring 507.

The other lens 501Y and 501M are held with the blocks 504 and 505 through eccentric rings 508 and 509, respectively, and the blocks 504 and 505 are aligned and slidably inserted in the channel 506. The eccentric rings 508 and 509 can be rotated in the blocks 504 and 505, respectively, and therefore, the lens 501Y and 501M can be rotated around the respective axes of the rings 508 and 509 which are displaced from the respective optical axes of the lens 501Y and 501M. The structure shown in FIG. 9 is common to all of the eccentric rings 507-509, and therefore, the respective axes of the lens 501Y, 501M and 501C can be moved or changed around the respective axes of rings 508 and 509. Since the eccentric rings 507-509 can be individually rotated, the change of the optical axis can be attained for each lens, individually.

The reference block 503 consists of first through third block parts 503a-503c, where the third block part 503c interconnects or bridges the first and second block parts 503a and 503b. A window WD is formed in the third block part 503C, through which the lens 501Y and 501M are exposed to the space under the lens holder 502. The side walls of the channel 506 are defined by the respective side surfaces of the first and second block parts 503a and 503b, while the bottom limit of the channel 506 is defined by the upper surface of the third block part 503c.

The blocks 504 and 505 are capable of sliding in the channel 506 along the longitudinal direction T of the channel 506, which is perpendicular to the respective optical axes of the lens 501Y, 501M and 501C. Dovetail grooves 515 are formed on the respective side surfaces of the blocks 504, one of which is hidden in FIG. 8. Through the second block part 503b, screw holes 516 and 517 are provided in the lateral direction. The screw holes 517 are aligned along the dovetail grooves 515, and a ball 519 and a spring 520 are inserted in each of the holes 517. A screw 521 is then screwed into the hole 517, to push the ball 519 through the spring 520. Accordingly, the ball 519 fits the dovetail groove 515 while being pushed thereto. By means of the combination of the dovetail groove 515 and the ball 517, smooth sliding of the blocks 504 and 505 is ensured.

When adjustment of the lens position, which will be described later in detail, is completed, screws 518 are screwed into the screw holes 516, respectively, to fix the respective positions of the blocks 504 and 505 in the channel 506. The screw holes 516 are provided in the positions displaced from the dovetail grooves 515. As understood from the above description, the second block part 503b functions as a member in which slide smoothing means 519-520 and block fixing means 518 are provided.

On the upper surface 522 of the third block part 503b, a plate member 523 is fixed. The plate member 523 extends over the channel 506, to partially cover the respective upper surfaces of the blocks 504 and 505. A pair of slit holes 524 are formed through the plate member 523. A screw hole 525 is formed in each of the respective upper surfaces of the block 504 and 505, into which a eccentric screw 506 is screwed through the slit hole 524. The diameter of the head of the screw 526 is substantially equal to the width of the slit hole 524. When the screw 526 is rotated, the head of the screw 526 eccentrically rotates around the axis of the screw 526, to push the block 504 (505) in the direction T. Therefore, the blocks 504 and 505 can be individually displaced in the direction T while sliding in the channel 506 by rotating the corresponding screw 526.

In summary, the lens unit 500 is so constructed that the positional relationship between the lens 501Y, 501M and 501C can be varied in the plane on which the lens 501Y, 501M and 501C are arrayed. The relative displacement between the lens 501Y, 501M and 501C in the direction T is attained through the block slide, and that in the direction K perpendicular to the direction T is attained through the rotation of the eccentric rings 507-509.

(5-4) Geometric Arrangement of Optical Elements

As shown in FIG. 2A and FIG. 5, the color light generator 21, the original holder 400 holding the original plates 401Y, 401M and 401C, and the lens unit 500 are aligned in the vertical direction. The blue, green and red lights generated in the color light generator 21 penetrate the original plates 401Y, 401M and 401C, to be projected onto a common area 40 on the photosensitive sheet 11 through the projection lens 501Y, 501M and 501C, respectively, whereby a projected image J is obtained on the photosensitive sheet 11. The projected image J is a composite color image consisting of the color separated images whose respective positions are adjusted to each other on the common area 40.

Figure 10:
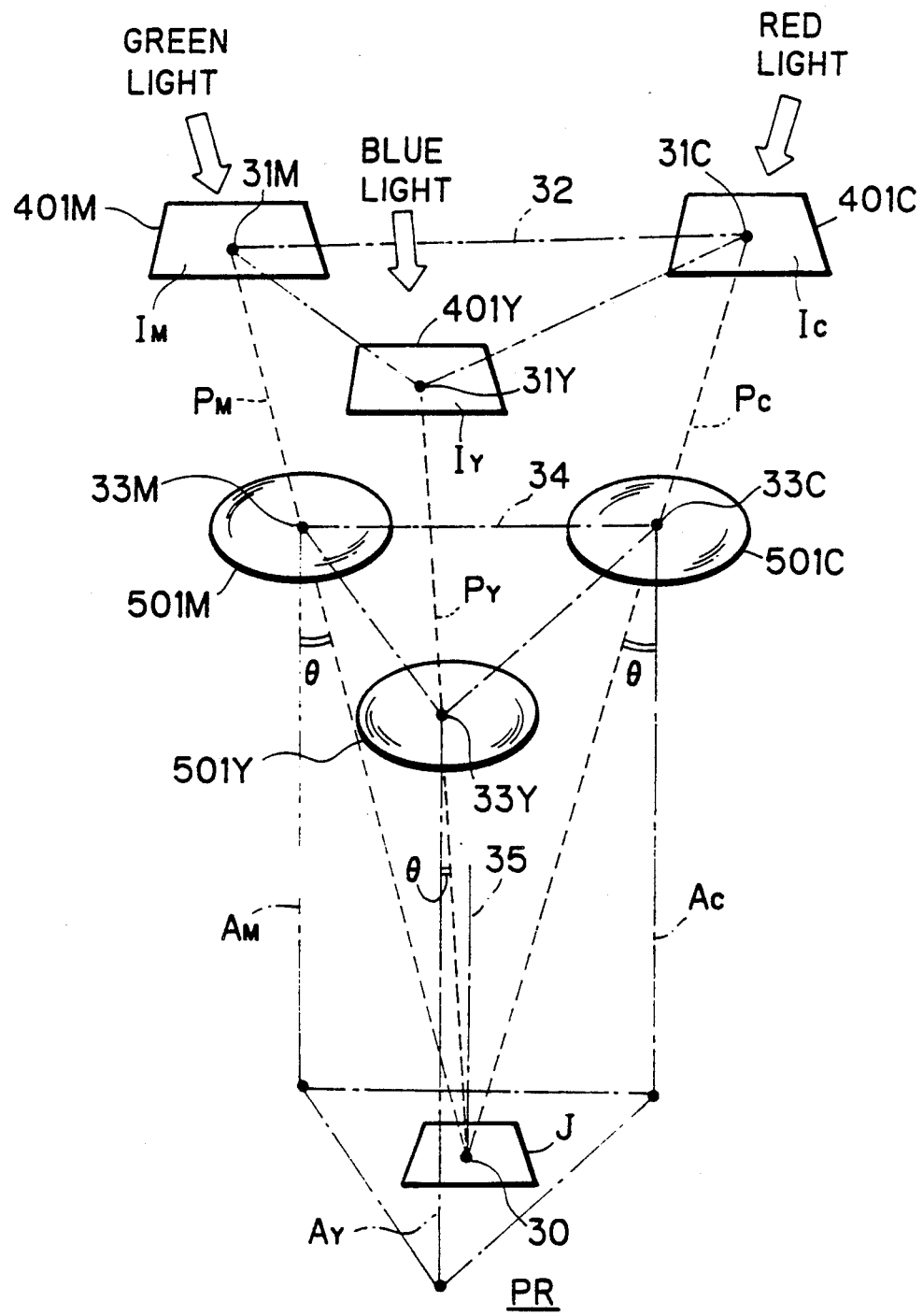
FIG. 10 is a schematic diagram showing the geometric arrangement of optical elements, where all of the color image projections satisfy an off-axis projection condition.

FIG. 10 is a schematic diagram showing the geometric arrangement of the optical elements. As to the cyan image projection, a line $P_C$ is so defined as to connect the center point 31C of the color separated image $I_C$ and the center point 30 of the projected image J, while a line $A_C$ represents the optical axis of the lens 501C, which is also shown in FIG. 9 as the axis 514. Similarly, a line $P_M$ connects the center point 31M of the color separated image $I_M$ and the point 30, and a line $P_Y$ connects the center point 31Y of the color separated image $I_Y$ and the point 30. Axes $A_M$ and $A_Y$ are the optical axes of the lens 501M and 501C, respectively. The center points 31Y, 31M and 31C are positioned at the respective apexes of an equilateral triangle 32, and the respective center points 33Y, 33M and 33C of the lens 501Y, 501M and 501C are positioned at the respective apexes of another equilateral triangle 34.

All of the optical axes $A_Y$, $A_M$ and $A_C$ extend in the vertical direction or the direction perpendicular to the projection plane PR, while the lines $P_Y$, $P_M$ and $P_C$ are inclined from the vertical direction by a common angle $\theta$. Further, the lines $P_Y$, $P_M$ and $P_C$ and the axes $A_Y$, $A_M$ and $A_C$ intercross at the center points 33Y, 33M and 33C of the lens 501Y, 501M and 501C, respectively. The condition where a line connecting the center point of a color separated image and the center point of a projected image crosses the axis of a projection lens at the inside of the projection lens will be hereinafter called as "off-axis projection condition". In the preferred embodiment, the off-axis projection condition is satisfied in each of the color separated image projections, and further, the optical arrangement shown in FIG. 10 has a rotational symmetry around the line 35 passing the center point 30 of the projected image J and extending in the vertical direction. In other words, the projected image J is obtained in the center area of a region where the respective fields of view of the lens 501Y, 501M and 501C are overlapped. Therefore, the projection magnitudes of the respective color separated images are substantially common to each other.

Under the off-axis projection condition, the color component image lights obtained through the color separated images $I_Y$, $I_M$, $I_C$, respectively, are supplied to the lens 501Y, 501M and 501C, with a common or nearly common angle. Accordingly, the influences of the spherical aberration on the image projection are substantially common to all of the lens 501Y, 501M and 501C. As a result, the projected image J has substantially no color deviations, to obtain a reproduced image faithful to the original color image.

Figure 11:
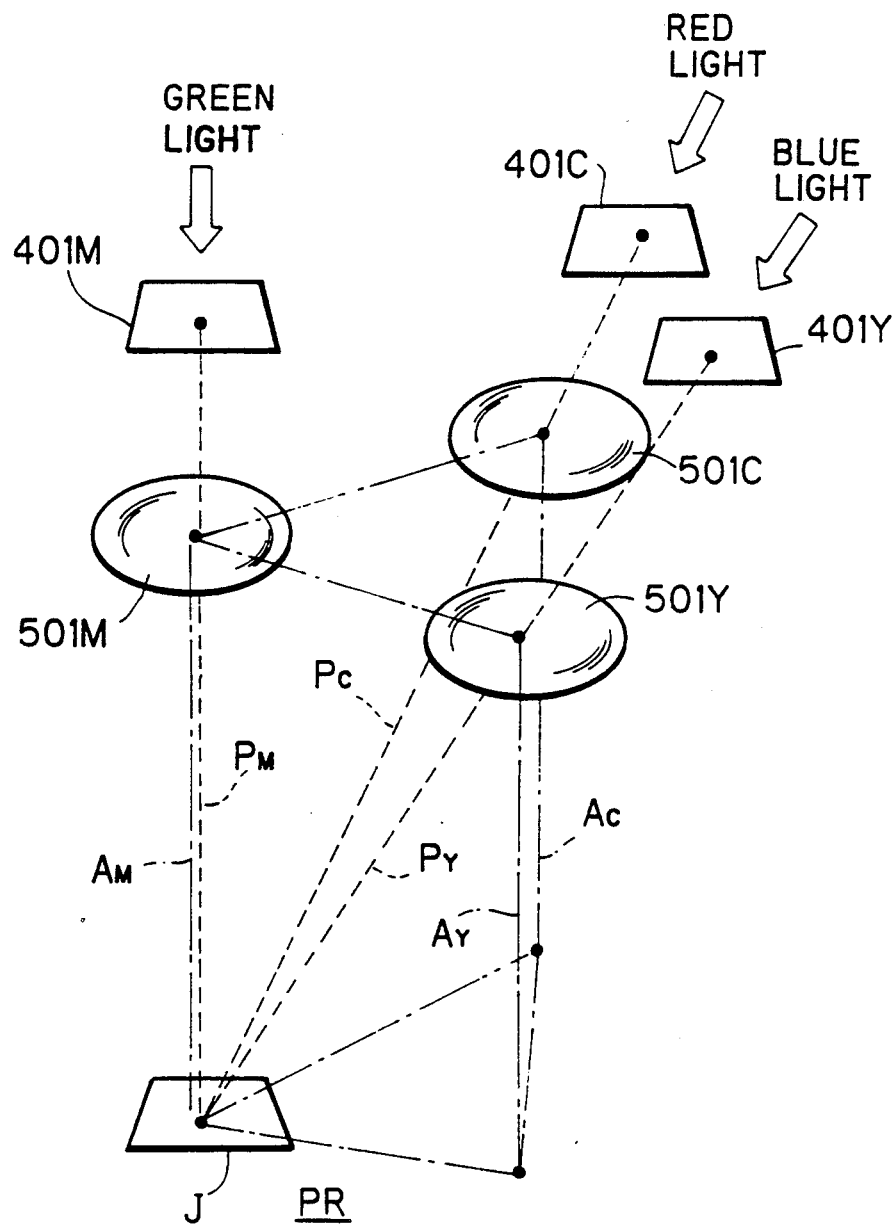
FIG. 11 shows an example of the geometric arrangement in which one of the color image projections does not satisfy the off-axis projection condition.

FIG. 11 shows an example of the optical arrangement in which the magenta image projection with green light does not satisfy the off-axis projection condition, that is, the line $P_M$ coincides with the optical axis $A_M$ of the lens 510M and they do not intercross. In order to project the respective color separated images onto a common area, the lines $P_Y$ and $P_C$ must be inclined from the optical axes $A_Y$ and $A_Y$ by large angles, respectively. Accordingly, the influence of the spherical aberrations in the lens 501Y and 501C on the projected image J is different from that in the lens 501M, whereby color deviations may be occur in the projected image J. From the comparison between FIG. 10 and FIG. 11, it is understood that the arrangement of FIG. 10 is superior to that of FIG. 11. It is prefered that the mirrors 23 shown in FIG. 2A are inclined form the axes $A_Y$, $A_M$ and $A_C$ by the angle $\theta$ to generate the color lights whose light path are inclined as illustrated in FIG. 10 by the fat arrows. Further, since the light path is inclined from the optical axes of the lens 501Y, 501M and 501C in the arrangement shown in FIG. 9, it is preferred to employ lens having small spherical aberration or curvature error. Incidentally, the number of lens provided in the lens unit may be two, when the image projector is used for an image recording in double-tone. Furthermore, the number of lens may be larger than three, and in this case, it is preferred that the lens are arranged at the respective apexes of a regular polygon. The image projector 20 can be employed as that for projecting images in a liquid crystal display device, whereby a fine color image can be obtained on a liquid crystal imaging plane.

(5-5) Adjustment of Optical Elements and Exposure of Sheet 11

The process of exposing the photosensitive sheet 11 with the image projector 20 is as follows: First, original plates on which color separated test images are recorded are set in the original holder 400, and the respective images of the original plates are projected onto a sheet placed on the exposure table 300. If the positional relationship between the lens 501Y, 501M and 501C is different from the desired one, the projected yellow, magenta and cyan images $J_Y$, $J_M$ and $J_C$ shown in FIG. 12A are displaced from each other.

In the next process step, the eccentric rings 507-509 of FIG. 8 are manually rotated, to adjust the respective positions of the images $J_Y$, $J_M$ and $J_C$ to a common position in the direction K shown in FIG. 12B, which is perpendicular to the longitudinal direction T of the channel 506.

Then, the eccentric screws 526 are manually rotated, to move the blocks 504 and 505 in the direction T until the images $J_Y$, $J_M$ overlap with the image $J_C$. Through the process steps, the adjustment of the lens unit 500 is completed, to obtain overlapped images.

As is understood from the above description with reference to FIG. 12A and FIG. 12B, the images $J_Y$, $J_M$ and $J_C$ can be overlapped as long as at least two lens (501Y and 501M, for example) are movable in the directions T and K. Therefore, the lens 501C may be mounted in the reference block 503a without the eccentric ring 507.

In general, when first through N-th lens are provided for projecting color separated images on a comman area, the lens holder is so constructed that as least $(N-1)$ lens are movable in the plane on which the first through N- the lens are arranged, where N is an integer larger than one. It is also permitted that a first set of $(N-1)$ lens are movable in the first direction on the lens arrangement plane, and a second set of $(N-1)$ lens, which may be fully or partially different from the first set, are movable in the second direction on the lens arrangement plane, where the first and second directions are different from each other. For example, the eccentric ring 508 or 509 can be omitted under the condition where the other two eccentric rings 509 and 507 (or 507 and 508) are not omitted. If the eccentric lens 508 is omitted, the positional adjustment of the images $J_Y$, $J_M$ and $J_C$ in the direction K shown in FIG. 12 is attained by moving the images $J_M$ and $J_C$ to the image $J_Y$ through rotation of the eccentric rings 507 and 509.

On the other hand, when all of the lens 501Y, 501M and 501C are held in the original holder 500 through the eccentric rings 507-509 as the embodiment shown in FIG. 8, the position at which the images $J_Y$, $J_M$ and $J_C$ are overlapped with each other can be varied in the direction K.

When the adjustment of the lens unit 500 is completed, the original places having the test images are removed from the original holder 400, and the original plates 401Y, 401M and 401C for the actual recording are set in the original holder 400. Then, the photosensitive sheet 11 is conveyed to the exposure stage 300, and the conveyance of the sheet 11 is temporally stopped for exposure of the sheet 11.

The light sources 22 are then turned on, and the color separated images on the original plates 401Y, 401M and 401C are projected on the common area 40 (FIG. 5) of the photosensitive sheet 11, whereby a projected image J is formed thereon. The microcapsules on the photosensitive sheet 11 are selectively exposed by the imaging lights, and the microcapsules of yellow, magenta and cyan are selectively photohardened with the blue, green and red imaging lights, respectively.

When the exposure is completed, the light sources 22 are turned off, and the photosensitive sheet 11 is conveyed by a predetermined distance with the conveyer mechanism 200, whereby the next area on the photosensitive sheet 11 is loaded on the exposure stage 300.

The light sources 22 are turned on again, and the exposure process is conducted for the next area. Through repitation of the intermittent conveyance of the sheet 11 and the exposure thereof, the projected images J are arrayed on the photosensitive sheet 11, as shown FIG. 13.

The peripheral regions 41 of the common areas or the imaging areas 40 are fully exposed, since the color separated images are recorded only on the central areas of the original plates 401Y, 401M and 401C, and the edge regions of the original plates 401Y, 401M and 401C are fully transparent. The lights having penetrated through the edge regions are supplied to the peripheral regions 41, thereby to expose the same. All of the microcapsules existing on the peripheral regions 41 are photohardened, and the dye in the microcapsules does not go out from the microcapsules even if they are pressed. Therefore, the undesired color is not printed on the peripheral region of the receiver paper 12 in the later process of pressing the receiver paper 12 to the photosensitive sheet 11.

On the other hand, boundary regions 42 shown in FIG. 13 are not exposed with lights, and therefore, the microcapsules on the boundary regions 42 are destroyed if they are pressed. In order to prevent the destruction, the press mechanism 700 shown in FIG. 2B is so constructed as not to press the boundary regions 42, as will be described later, whereby the dye in the microcapsules on the boundary regions 42 does not go out from the microcapsules, and the press mechanism 700 and the others are not soiled with the dye.

(5-6) Other Examples of Image Projector

FIG. 14 shows another image projector 20a which can be employed in the present system. The image projector 20a has a single light source 22 and a single reflection mirror 23 reflecting the light emitted form the light source 22. Under the light source 22, a filter holder 51 and an original holder 451 are arranged in the vertical direction. The filter holder 51 and the original holder 451 are fixed to a common axis or rod 50, and they can be rotated around the axis 50 when the axis 50 is rotated. Blue, green and red filters 52B, 52G and 52R are mounted in the holes provided in the filter holder 51, respectively. The original plates 401Y, 401M and 401C are held with the original holder 451, where the original plates 401Y, 401M and 401C are positioned below the filters 52B, 52G and 52R, respectively. A single projecting lens 551 is provided below the original holder 451, in which the light source 22 and the lens 551 are aligned in the vertical direction.

In the process of exposing the photosensitive sheet 11, the filter holder 51 and the original holder 451 of turret type are rotated until the red filter 52R and the original plate 401C for cyan are aligned between the light source 22 and the lens 551. Then, the light source 22 is turned on, thereby to project the cyan image onto the photosensitive sheet 11. After the first exposure, the filter holder 51 and the original holder 451 are again rotated until the green filter 52G and the magenta image $I_M$ are aligned between the light source 22 and the lens 551, and then, the second exposure for magenta image is conducted on the common area 40 of the sheet 11. The third exposure for the yellow image is also performed similarly, to obtain the exposed image J in which the color separated images are overlapped.

The image projector 20a is simple in structure, but relatively long time is required for the exposure, since the first through third exposures should be attained in series. It is to be noted that the image projector 20 shown in FIG. 2A is operable to conduct the respective exposure steps for three colors in parallel, whereby the exposures can be attained in a relatively short time.

Figure 15:
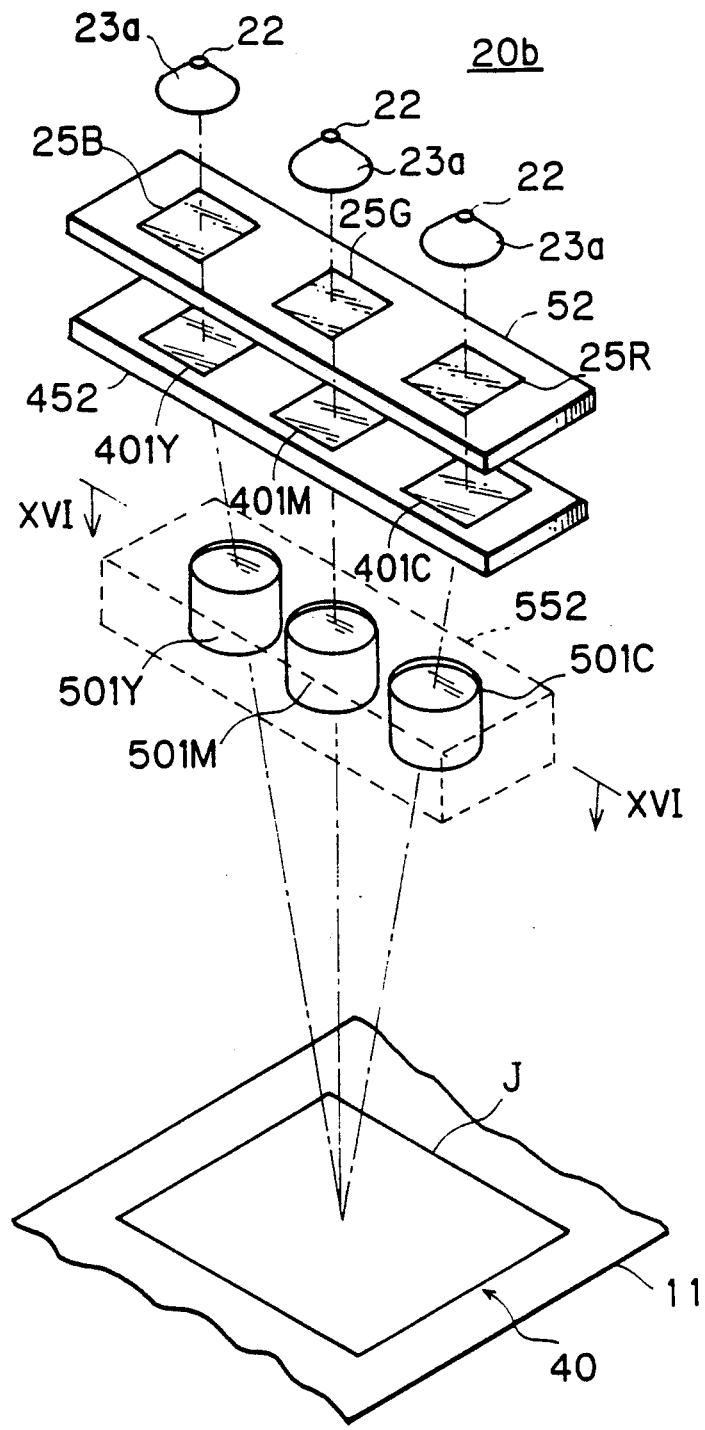
FIG. 15 shows another image projector.

FIG. 15 shows another image projector 20b. Light sources 22 are aligned in the horizontal direction, and reflection mirrors 23 are provided to the light sources 22, respectively. Color filters 25B, 25G and 25R of blue, green and red are aligned and held with a filter holder 52. Under the filter holder 52, an original holder 452 holding the original plates 401Y, 401M and 401C is provided, in which the original plates 401Y, 401M and 401C are aligned and positioned under the filters 52B, 52G and 53R, respectively. A lens unit 552 has projection lens 501Y, 501M and 501C aligned in the horizontal direction. The intervals between the projection lens 501Y, 501M and 501C are smaller than those between the original plates 401Y, 401M and 401C, and the respective color separated images on the original plates 401Y, 401M and 401C are projected onto a common area 40 of the photosensitive sheet 11. Although the lens 501M is positioned just under the original plate 401C, the other lens 501Y and 501C are displaced from the positions just under the original plates 401Y and 401M. The lens 501Y and 501C satisfy the off-axis projection condition.

Figure 16:
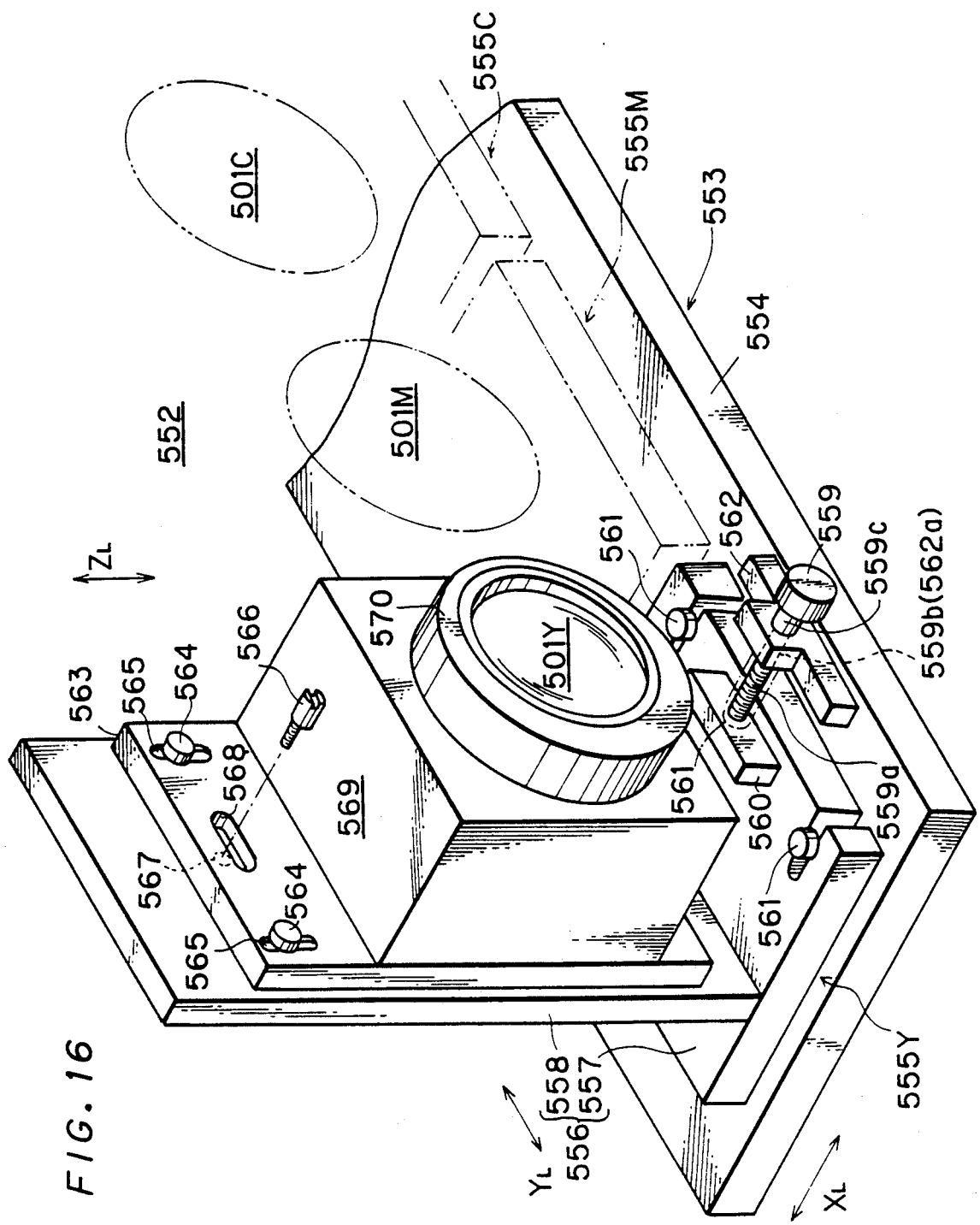
FIG. 16 is a partial view of the lens unit in the direction of an arrow XVI—XVI in FIG. 15.

FIG. 16 is a partial internal view of the lens unit 552 in the direction of the arrow XVI—XVI in FIG. 15. The lens unit 552 has a lens holder 553 holding the lens 501Y, 501M and 501C. The lens holder 553 comprises a base plate 554 on which holder blocks 555Y, 555M and 555C are aligned. Although only the holder block 555Y is illustrated in detail, each of the other holder blocks 555M and 555C has the same structure with the holder block 501Y. The holder block 501Y has a block body 556 consisting of a floor plate 557 and a wall plate 558 fixed on the floor plate 557. A screw 559 is provided on the base plate 554, and the screw 559 is screwed into the screw hole formed in the member 560 which is fixed on the floor plate 557. A spring 561 is provided between the member 560 and another member 562 through which the screw 559 is connected to the base plate 554, and the foot 559a of the screw 559 is surrounded by the spring 561. No screw groove is formed in the intermediate part 559b of the screw 559, and the intermediate part 559b is inserted in a hole 562a provided through the member 562. The diameter of the neck 559c of the screw 559 is larger than that of the hole 562a.

When the screw 559 is rotated, the block body 556 slides in the direction $X_L$, to adjust the position of the lens 501Y in the direction $X_L$ which is parallel to the respective optical axes of the lens 501Y, 501M and 501C. After the adjustment, the block body 556 is fixed on the base plate 554 with bolts 561.

A plate 563 is slidably attached to the wall plate 558 with screws 564 being inserted in slit holes 565 formed in the plate 563. An eccentric screw 566 is screwed into a screw hole 567 formed in the wall plate 558 through a slit hole 568 formed in the plate 563. Therefore, when the screws 564 are somewhat loosened and the eccentric screw 568 is rotated, the plate 563 is moved in the direction $Z_L$, where the directions $X_L$, $Y_L$ and $Z_L$ are perpendicular to each other.

A hollow box 569 is fixed on the plate 563, and the lens 501Y is mounted on the box 569 through an eccentric ring 570 which can be rotated around the axis thereof. When the eccentric ring 570 is rotated, the lens 501Y is also rotated around the rotation axis being displaced from the optical axis of the lens 501Y is moved in the directions $Y_L$ and $Z_L$.

Accordingly, the position of the lens 501Y can be arbitrarily varied in the directions $X_L$, $Y_L$ and $Z_L$ through rotation of the screw 559, the eccentric screw 566 and the eccentric ring 570. By moving the lens 501Y, 501M and/or 501C, the adjustment of the color component images on the photosensitive sheet 11 is attained.

Figure 17:
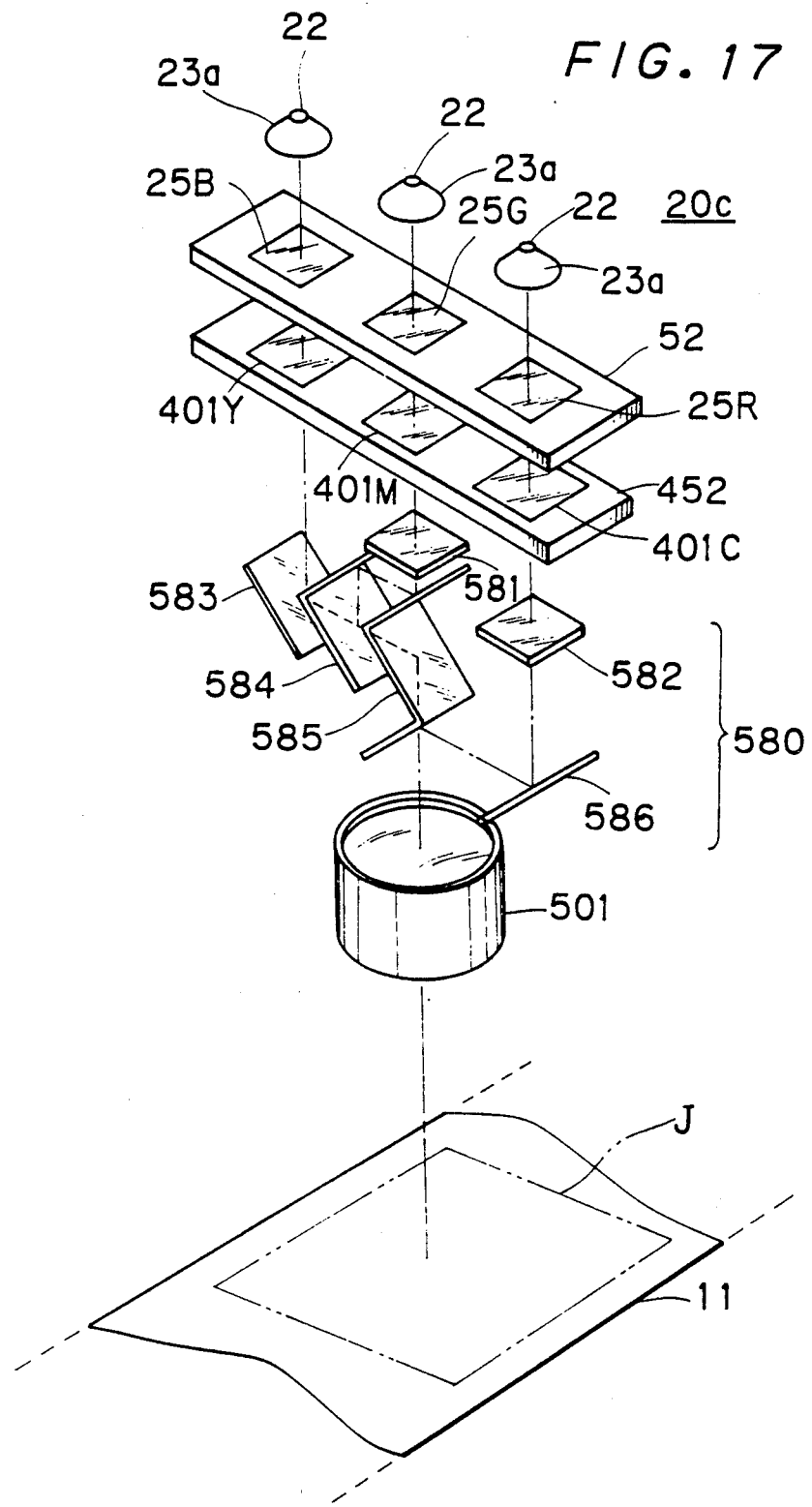
FIG. 17 shows further another example of an image projector.

FIG. 17 shows further another example of an image projector 20c. As is understood form comparison of FIG. 17 with FIG. 15, the filter holder 52 and the original holder 452 in the image projector 20b are employed also in the image projector 20c. However, only a single projection lens 501 is provided in the image projector 20c, and a mirror system 580 is provided between the original holder 452 and the lens 501.

Figure 18:
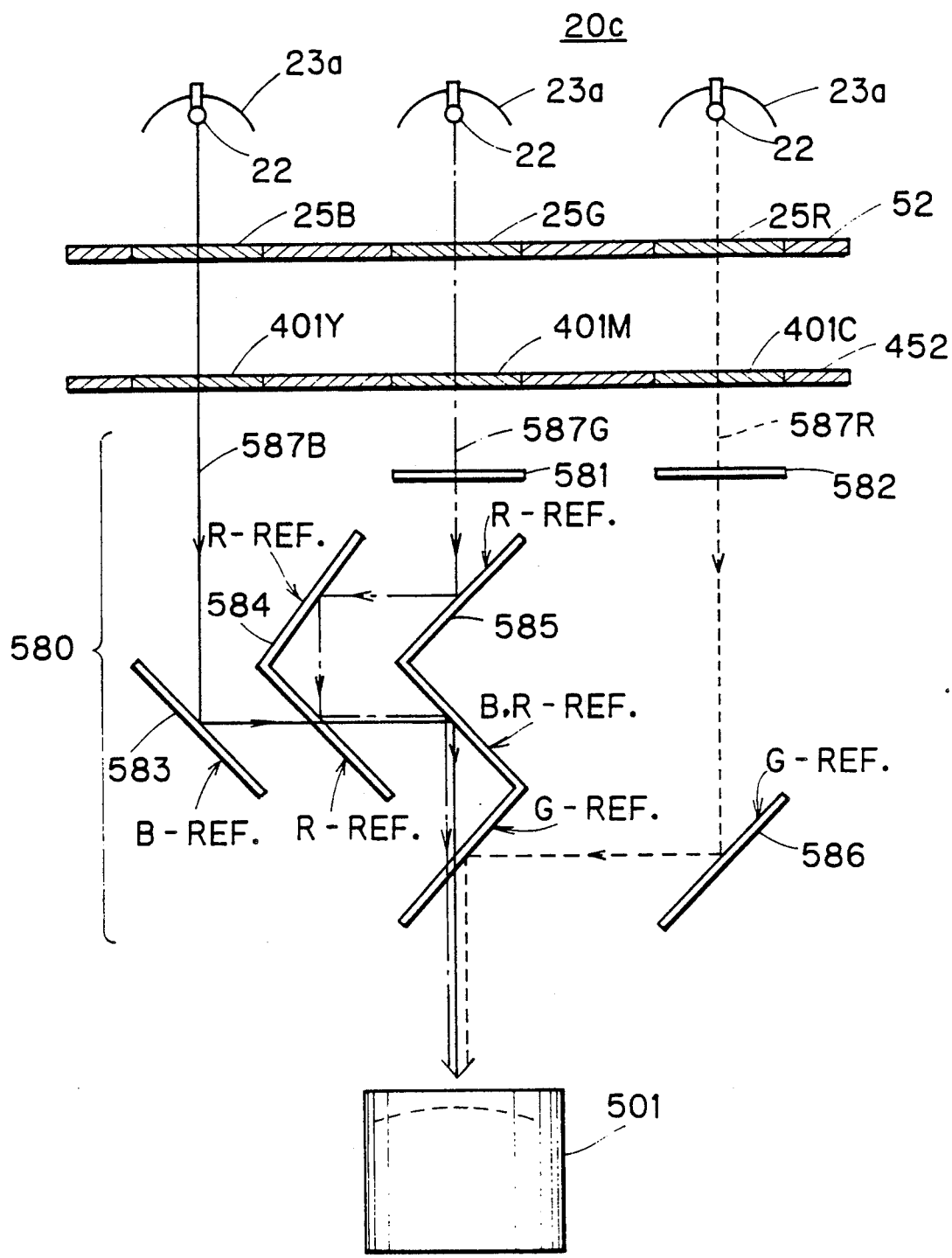
FIG. 18 is a side view of the image projector shown in FIG. 17, FIG. 19 through FIG. 21 show examples of the structure for periodically separating press rollers from each other.

FIG. 18 is a side view of the image projector 20c, where some elements are illustrated as sections. The mirror system 580 comprises dichroic mirrors 583–586 and glass plates 581 and 582. The respective surfaces of the mirrors 583–586 are inclined from the vertical direction by (+45°) or (−45°). The reference symbols "B-REF.", "G-REF." and "R-REF." indicate blue, green and red light reflection mirror surfaces, respectively. Similarly, "B,R-REF." indicates mirror surface reflecting both of a blue light and a red light.

The blue, green and red lights 587B, 587G and 587R are reflected by the mirror system 580 as shown by arrows in FIG. 18, to reach the projection lens 501. The difference between the respective light path lengthes of the blue, green and red lights are compensated with the glass plates 581 and 582 whose reflection indexes are larger than that of the air. The composite light supplied to the lens 501 is focused on the photosensitive sheet 11 (FIG. 17) through the projection lens 501, whereby the projected image J is obtained thereon.

When an image projector is so constructed as to have a single projection lens as shown in FIG. 14 or FIG. 17, the projection magunitude is changed by only changing the position of the single projection lens, whereby the magnitude of the projection can be easily changed.

(6) Receiver Paper Feeder 600

The exposed area of the photosensitive sheet 11 is buffered with the dancer roller 221 shown in FIG. 2A, and then transmitted to the position below the receiver paper feeder 600 shown in FIG. 2B through a transmission roller 620. The receiver papaer feeder 600 comprises a fetching roller 601 for fetching the receiver paper 12 one by one from the stack 602 of the receiver papers. The receiver paper 12 fetched along the direction C is fed to and placed on the photosensitive sheet 11 through feeding rollers 603–605. The receiver paper 12 is so placed on the photosensitive sheet 11 that the active surface layer of the receiver paper 12 including the color coupler contacts the surface layer of the sheet 11 having the microcapsules. More particularly, since the microcapsules are provided on the upper surface of the sheet 11, the receiver paper 12 is so placed on the sheet 11 that the surface of the receiver paper 12 having the color coupler layer contacts the upper surface of the sheet 11. The receiver paper 12 placed on the sheet 11 is stopped with a roller 608 until the roller 608 release the receiver paper 12.

In the upperstream side of the receiver paper feeder 600, a photocoupler 607 is provided for detecting the punch hole (not shown) punched with the puncher 306 shown in FIG. 2A. The punch hole is formed every time the exposure is attained, and therefore, a series of punch holes are arrayed along the photosensitive sheet 11 at regular intervals being equal to the intervals between the exposed images J on the photosensitive sheet 11. Each of the punch holes indicates the position of the projected image, since the punch holes and the projected image have one-to-one correspondence in position.

When the photocoupler 607 detects the punch hole, the receiver paper 12 is released from the roller 608 with a predetermined time delay, to be conveyed with the sheet 11. In the preferred embodiment, the release of the receiver paper 12 from the roller 608 is attained by pushing up the roller 608 with an actuator 610. The time delay is equal to the time required for the exposed area of the sheet 11 to travel from the position of the photocoupler 607 to the position just under the receiver paper feeder 600 through the conveyance of the sheet 11. Thus, the receiver paper 12 is released when the exposed area of the photosensitive sheet 11 is just under the receiver paper 12. The feeding operation with the receiver paper feeder 600 is repeated, whereby the receiver papers 12 are overlaid on the sheet 11 at regular intervals. The receiver paper 12 placed on the sheet 11 is conveyed to the press mechanism 700 through a roller 609 with the sheet 11.

The press mechanism 700 comprises a pair of rollers 701 and 702 arranged in parallel. The photosensitive sheet 11 and the receiver paper 12 are catched between the press rollers 701 and 702, to be pressed to each other. The pressure for pressing the sheet 11 and the receiver paper 12 is variable by varying the force at which the rollers 701 and 702 are pushed to each other, and is previously set at a desired pressure. The lower side roller 702 is rotated by a motor 703 through an endless belt 704.

When the pressure is applied to the photosensitive sheet 11 and the receiver paper 12, the microcapsules being not photohardened are destroyed by the pressure, and the dye provided therein go out from the microcapsules. The dye is coupled to the color coupler on the receiver paper 12, to be colored through coloring reaction. More particularly, the dyes of yellow, magenta and cyan are colored to form a color-mixed image on the receiver paper 12. Since the receiver paper 12 is placed on the area of the photosensitive sheet 11 onto which the color separated images were projected, the color-mixed image on the receiver paper 12 is a color image corresponding to the original image.

In order to prevent the microcapsules on the boundary region 42 (FIG. 13) from being destroyed by the pressure applied through the roller 701 and 702, the rollers 701 and 702 is separated during the boundary region 42 passes through the press mechanism 700. The separation is attained by inserting a wedge member 705 into the space between the respective cylinders 701a and 702a of the rollers 701 and 702.

Figure 19:
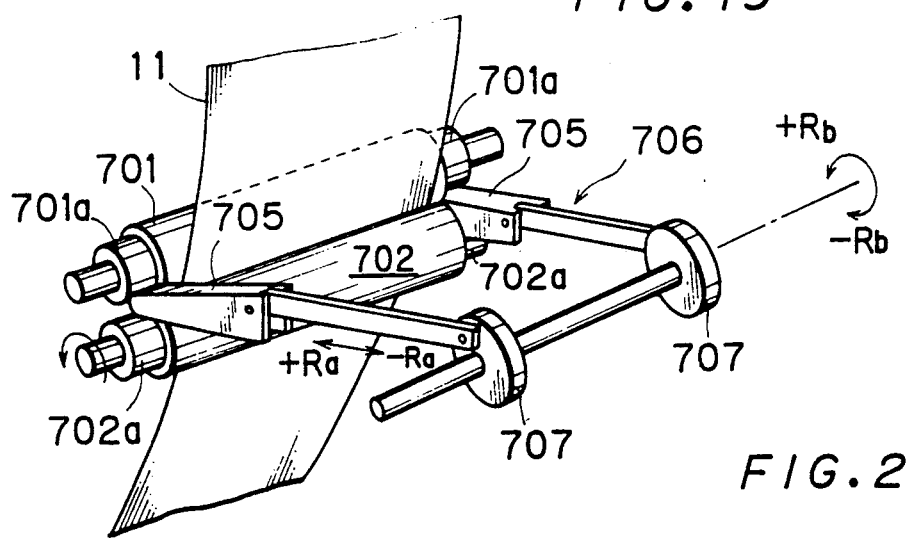

Although the wedge member 705 is illustrated only in the one side of the roller pair 701 and 702, the wedge member 705 is provided at each side of the roller pair 701 and 702, as shown in FIG. 19. The wedge members 705 are reciprocally moved in the directions ($+R_a$) and ($-R_a$) through links 706 driven by cams 707 rotating in the directions ($+R_b$) and ($-R_b$) alternatively. The movement of the wedge members 105 are synchronized with the conveyance of the sheet 11.

Figure 20:
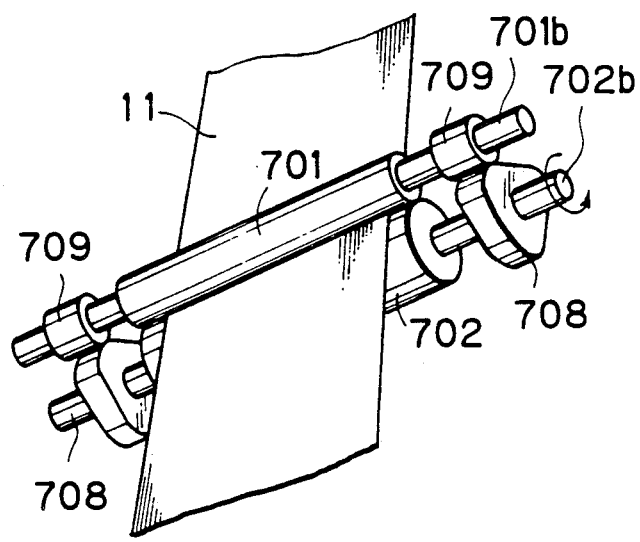
Figure 21:
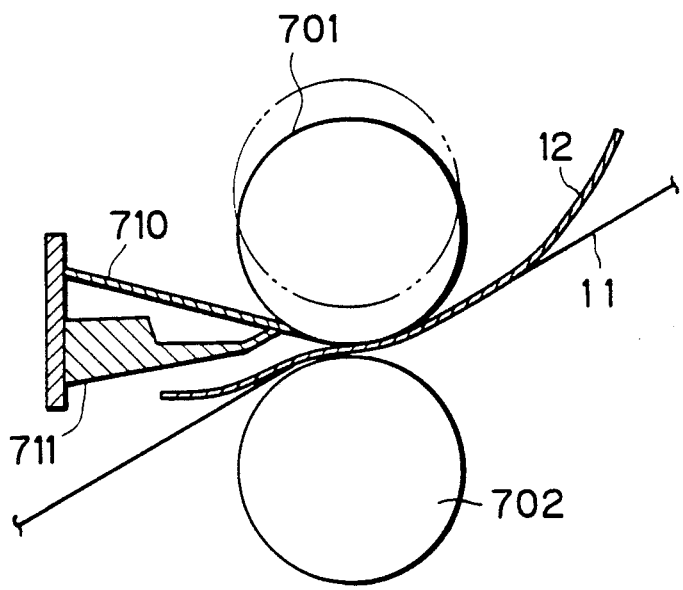

FIG. 20 shows another example for periodically separating the rollers 701 and 702 each other, in which rounded triangle cams 708 are provided on the shaft 702b of the driving roller 702 and following cams 709 are attached to the shaft 701b of the following roller 701. Through rotation of the driving roller 702, the cams 708 periodically push the following cams 709, to intermittently separate the following roller 701 from the driving roller 702. Further, as shown in FIG. 21, a scraper 710 and a scraper guide 711 may be provided at the downstream side of the roller 701, so that the receiver paper 12 is prevented from winding around the roller 701. The virtual circle in FIG. 21 shows the roller 701 being separated from the other roller 701.

Figure 22:
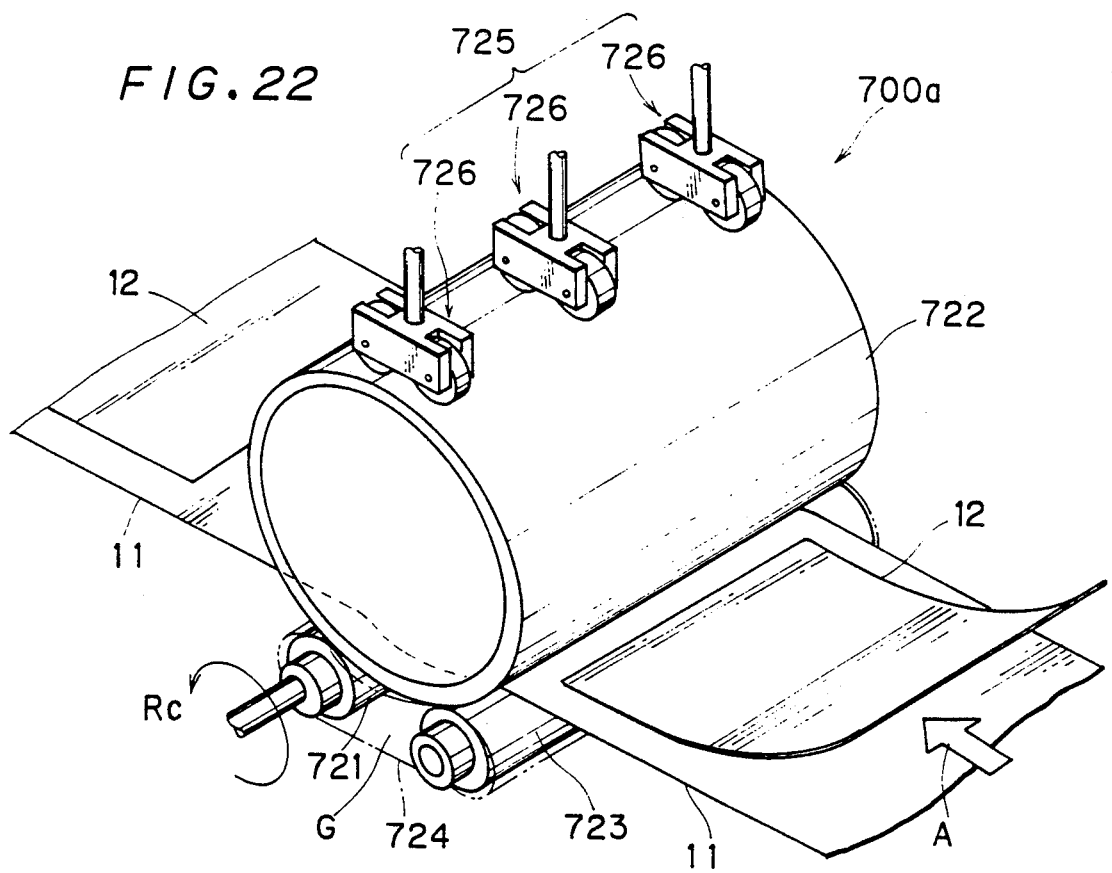
FIG. 22 is a perspective vie of a press mechanism.

FIG. 22 shows another press mechanism 700a, which can be employed in place of the press mechanism 700. The press mechanism 700a is provided with a driving roller 721 driven by a motor (not shown) to be rotated in the direction $R_c$. In parallel to the driving roller 721, a following roller 722 and a free roller 723 are arranged. The driving roller 721 and the free roller 723 are separated from each other with a gap G. The following roller 732 is an elastic cylinder whose shape in section can be deformed from a circle when the roller 722 is pressed in the direction perpendicular to the axis of the cylinder. Preferably, the following roller 722 is made of a hard elastic material such as a thin steel cylinder. The diameter of the following roller 722 is larger than that of the other rollers 721 and 723, and the following roller 722 contacts the other rollers 721 and 723.

Figure 23:
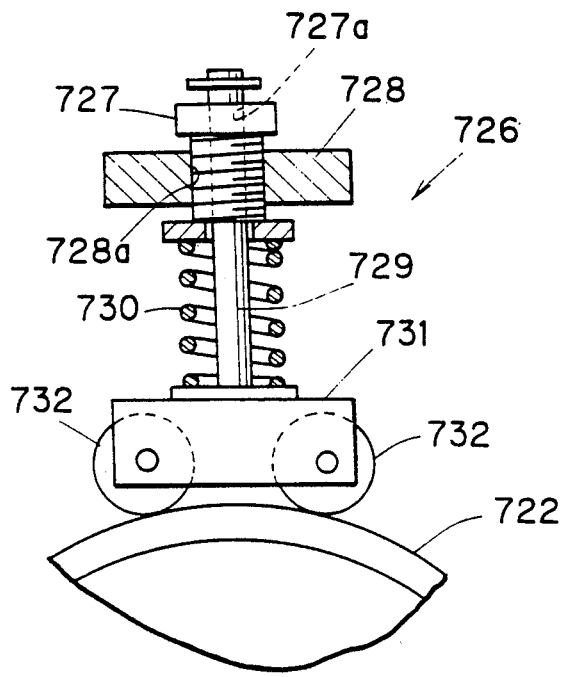
FIG. 23 is a side view, partly in cross section, of a pushing unit.

In order to apply a pressure to the following roller 722 toward the gap G, a pushing mechanism 725 is provided on the following roller 722. The pushing mechanism 725 has a plurality of pushing units 726 aligned along the axis of the roller 722. Referring to FIG. 23, each of the pushing units 726 comprises a pair of wheels 732 rotatably supported by a bogie 731 and contacting the circumferential surface of the roller 722, where the wheels 732 can rotate around their respective axes. A vertical rod 729 is fixed on the bogie 732, and the upper portion of the rod 729 is inserted into a through hole 727a provided in a bolt 727. The bolt 727 is inserted into a screw hole 728a formed in a pushing bar 728 which is common to all of the pushing units 726. A spring 730 is provided around the rod 729, to generate a repulsive force between the bogie 731 and the pushing bar 728.

According to the structure shown in FIG. 22 and FIG. 23, an uniform pressure can be applied to the receiver paper 12 and the photosensitive sheet 11 through the pushing mechanism 725 and the following roller 722 by applying a downward pressure to the pushing bar 728. The respective pressures transmitted through the pusing units 726 can be individually adjusted by rotating the corresponding bolt 727. The spring 730 is lengthened or shortened according to the rotation of the bolt 727, and the repulsive force between the bogie 731 and the pushing bar 728 is varied. Even if the pressure transmitted through one of the pushing units 726 is larger than that of the other pushing units, the unbalance of the pressures is absorbed by the elastic deformation of the following roller 722, thereby to obtain the uniform pressure.

Figure 24:
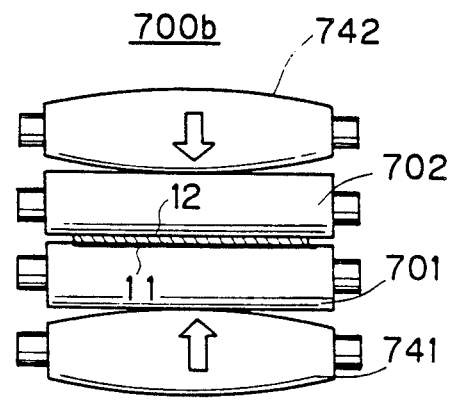
FIG. 24 shows another press mechanism to be compared with the press mechanism shown in FIG. 22, FIG. 25A and FIG. 25B show an operation of the press mechanism shown in FIG. 22.

In order to further clarify the character of the press mechanism 700a, another press mechanism 700b shown in FIG. 24 is considered, in which pressures are applied to the rollers 701 and 702 by crown rollers 741 and 742, as illustrated with fat arrows. When high pressure is applied to the receiver paper 12 and the photosensitive sheet 11 through the crown roller 741 and 742, the respective axes of the rollers 701 and 702 sometimes incline from the horizontal line, and the parallel arrangement thereof is lost, i.e., a skew is caused in the rollers 701 and 702. Therefore, high accuracy in fabrication and installation of the rollers 701 and 702 are required to prevent the skew in the mechanism 700b.

On the other hand, such a skew is not caused in the improved mechanism 700a even if a high pressure is applied thereto, since the unbalance of the pressure is absorbed by the deformation of the elastic roller 722, and the contact surface between the rollers 721 (723) and 722 is always parallel to the axis of the roller 721 (723). Accordingly, a uniform pressure is applied to the receiver paper 12 and the photosensitive sheet 11, whereby the paper 12 and the sheet 11 are prevented from being crinkled by the unbalance of the pressure.

Further, since three pushing units 726 are provided and there are two pressing surfaces, one of which is the boundary surface between the rollers 721 and 722 and the other is the boundary surface between the rollers 722 and 723, the pressure required to push each of the roller units 726 is one sixth as compared with the pressure (2800 kg/330 mm, for example) required in the mechanism 700b.

Figure 25A:
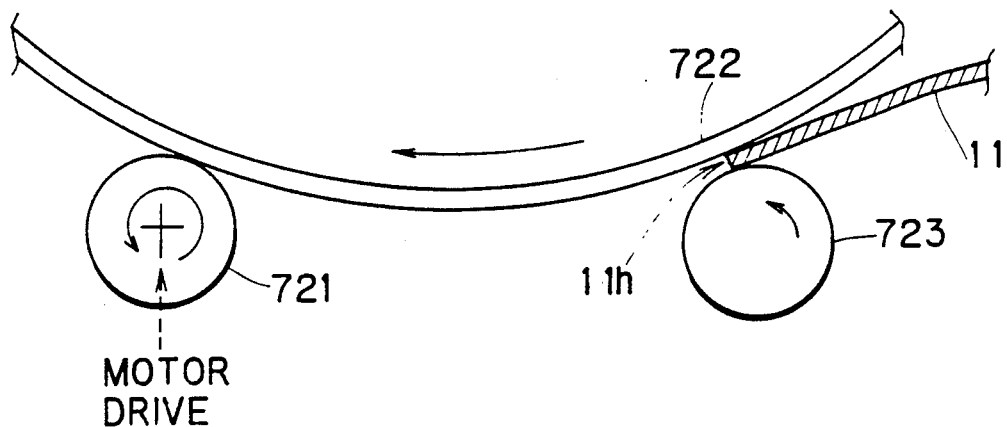
FIG. 25C shows an operation of a press mechanism in which a driving roller is provided in an upstream side of a process path.

Another advantage of the press mechanism 700a is that the head of the photosensitive sheet 11 can be taken in by a large force, and the reason thereof is as follows: As shown in FIG. 25A, where respective rotating speeds or forces of the rollers 721-723 are expressed by the length of arrows, the rollers 722 and 723 are separated from each other by the thickness of the sheet 11, when the head 11h of the sheet 11 is taken in between the rollers 721 and 723. However, since the press mechanism 700a is so constructed that the driving force is transmitted from the driving roller 721 to the following roller 722, and further transmitted from the following roller 722 to the free roller 723, the driving force is transmitted to the following roller 722 even if the rollers 722 and 723 are separated from each other. Accordingly, the taken-in force is certainly applied to the sheet 11 through the following roller 722.

Figure 25B:
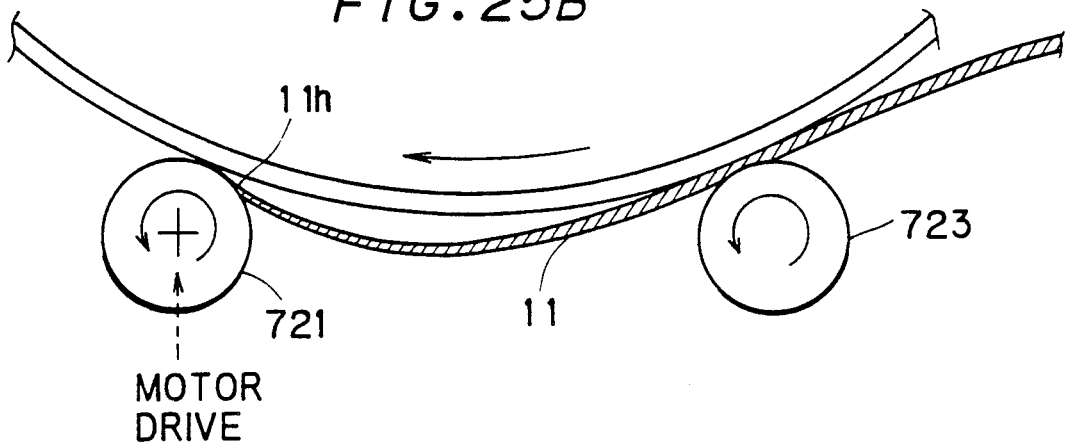

On the other hand, when the sheet head 11h reaches the driving roller 721 as shown in FIG. 25B, the head 11 has been already pressed by the following roller 722 and the free roller 723, and therefore, the thickness of the sheet head 11h has been reduced through the first press. Thus, the driving roller 721 and the following roller 722 are hardly separated from each other even when the sheet head 11 is being taken in between them. Accordingly, the driving force is sufficiently transmitted to the following roller 722, and the part of the sheet 11 existing between the rollers 722 and 723 is pressed and driven to the downstream side through the force applied from the following roller 722.

Figure 25C:
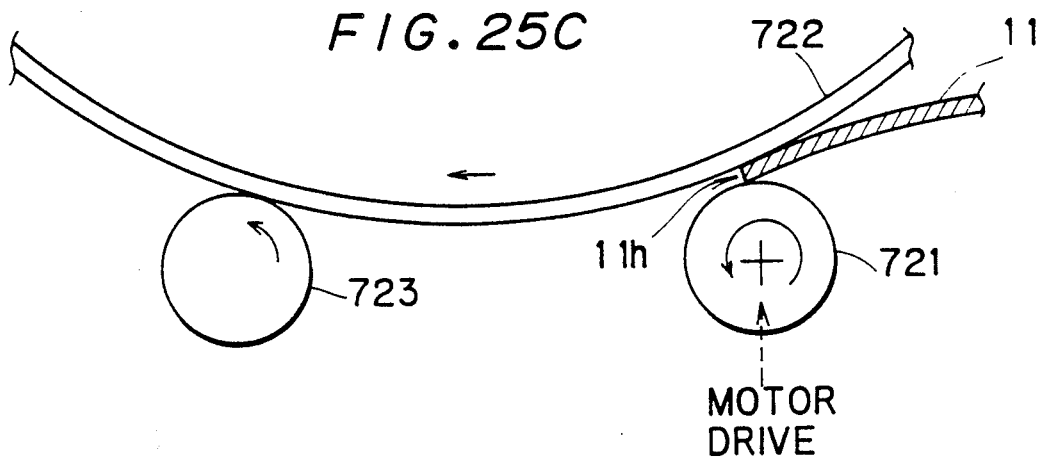

It is to be noted that the above indicated advantage is obtained by the construction that the roller 721 existing in the downstream side of the sheet 11 is driven by the motor. If the driving motor 721 is provided at the upstream side as shown in FIG. 25C, the driving force is not sufficiently transmitted from the roller 721 to the following roller 722, when the sheet head 11h is taken in between the rollers 721 and 722, since the rollers 721 and 722 are separated from each other by the sheet head 11 having relatively large thickness. Further, when two or more of the rollers 721-723 are individually driven in order to ensure the take-in operation, the driving mechanism is complicated as compared with that in the press mechanism 700a. Therefore, the press mechanism 700a is preferred in that the taken-in force is surely obtained by a relatively simple structure.

As shown in FIG. 22, a wide endless belt 724 may be provided around the rollers 721 and 723. In this case, the driving force is always transmitted from the driving roller 721 to the roller 723 through the endless belt 724, and therefore, the taken-in force is surely obtained even if the driving roller 721 is provided at the upstream side of the process path. Furthermore, the endless belt 724 prevents the distance between the rollers 721 and 723 from being increased by the pushing force applied through the following roller 722, thereby to obtain uniform pressure on the receiver paper 12 and the photosensitive sheet 11.

Incidentally, a single crown roller may be employed in place of the pushing mechanism 725 of FIG. 22. Even if the crown roller is employed, the press mechanism 700a is superior to the press mechanism 700b shown in FIG. 24, since the combination of rollers 721-723 has the advantage already described, and the required pressure is one half of that in the press mechanism 700b. The mechanism 700a may be employed in a laminater, for example, as well as the present image recording system.

(8) Separator 810 and Heater 820

The photosensitive sheet 11 and the receiver paper 12 are then conveyed to the separator 810 (FIG. 2B), to be separated from each other. The separator 810 comprises a pair of rollers 811 and 812 between which a wide endless belt 813 permeable to air is provided. The roller 812 is driven by a motor 815 through a transmission belt, whereby the endless belt 813 travels around the pair of rollers 811 and 812. A box member 814 connected to an exhaust blower 816 is provided in the space surrounded by the endless belt 813. A number of small holes are formed in the bottom surface of the box member 814, whereby air is sucked into the box member 814 when the exhaust blower 816 is enabled.

Accordingly, a suction force is applied to the receiver paper 12 through the permeable belt 813, and the receiver paper 12 is separated from the photosensitive sheet 11. The separated receiver paper 12 is conveyed to the downstream side of the separator 810 with the movement of the endless belt 813 while being attracted onto the lower surface of the endless belt 813 by the suction force.

The receiver paper 12 conveyed through the separator 810 is received by the heater 820. The heater 820 has a heating plate 821, under which a conveyer belt 822 is provided. The conveyer belt 822 is made of silicone rubber, for example, and travels around rollers 823 by rotating the rear side roller 823 with a motor 824. The receiver paper 12 passes through the heater 820 while being subjected to heat treatment with the heating plate 821, whereby luster is given to the color image on the receiver paper 12. The receiver paper 12 is then delivered to the downstream side of the heater 820, to obtain a stack 830 of the receiver paper 12 having recorded color images thereon.

(9) Rolling Mechanism 840

On the other hand, the photosensitive sheet 11 from which the receiver paper 12 has been separated is rolled in the rolling mechanism 840. More particularly, the photosensitive sheet 11 is conveyed to a roller 842 while being subjected to a constant tension applied with a tension pulley 841. The roller 842 is rotated by a motor 844, to send the photosensitive sheet 11 to a dancer roller 845. Since a torque limitter 843 is attached to the roller 842, the torque applied to the sheet 11 is limited to a predetermined value. The dancer roller 845 can move up and down in the direction B according to the difference between the tension of the sheet 11 and the gravity applied the roller 845, thereby to form a rolling buffer for the sheet 11.

The photosensitive sheet 11 is further conveyed through a roller 846 to a rolling shaft 847. The rolling shaft 847 is rotated by a mortor 848, so that the photosensitive sheet 11 is rolled around the shaft 847. The rolled photosensitive sheet 11 is disposed when the whole of the sheet 11 has been used and rolled around the shaft 847.

B. Internal Structure and Operation of Original Plate Exposure Unit 9

(1) Optical Structure

Figure 26:
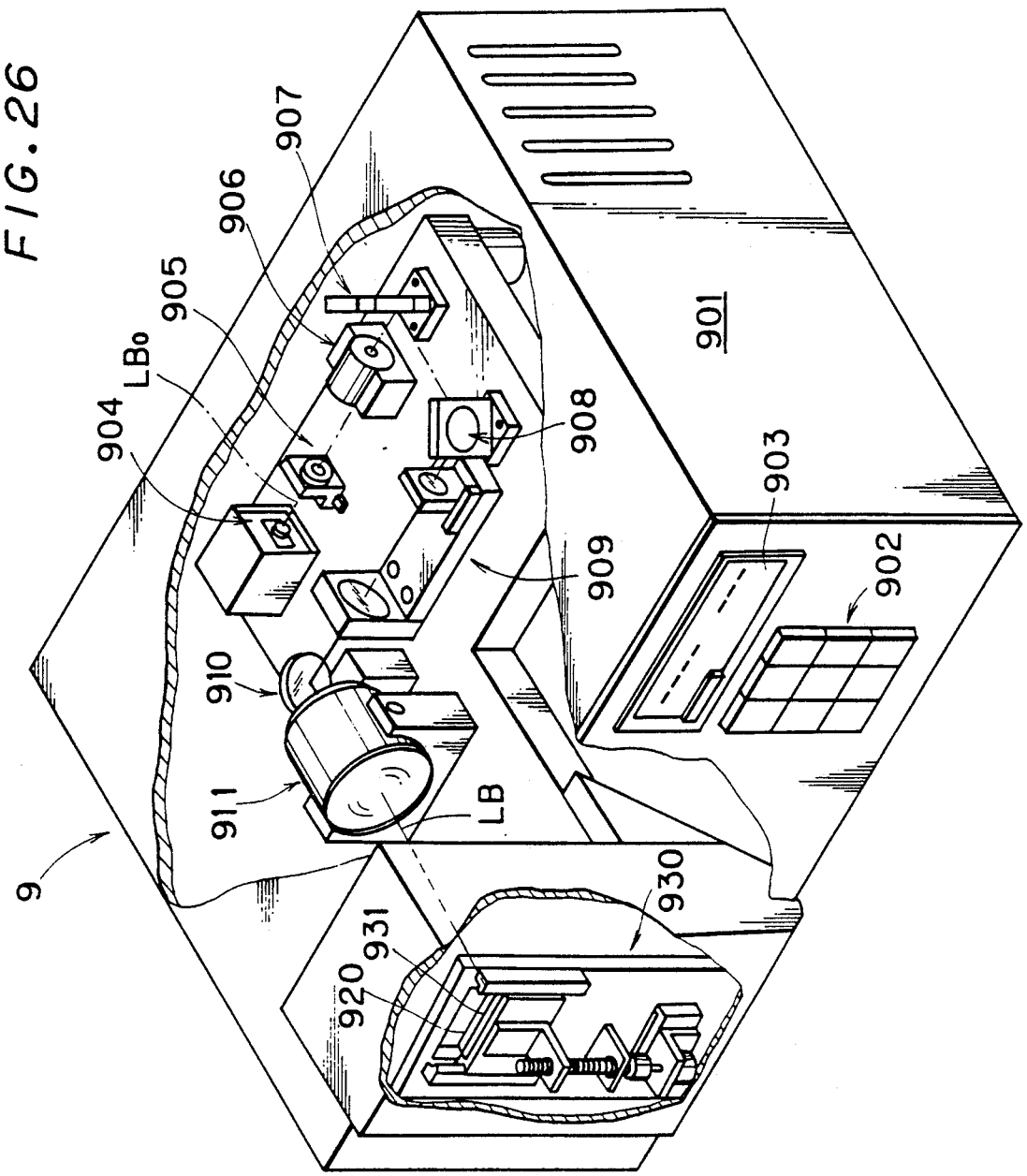
FIG. 26 is a perspective view, with portions broken away for clarify, of an original plate exposure unit.

FIG. 26 is a perspective view, with portions broken away for clarity, of the original plate exposure unit 9 for exposing a photosensitive original plate with laser, to record the color separated image thereon. Each of the original plates 401Y, 401M and 401C (FIG. 2A) employed in the color image recorder 11 is prepared in the exposure unit 9.

The original plate exposure unit 9 comprises a box member 901, in which optical elements and others are provided. Manual keys 902 and an indicator 903 are arranged on the front surface of the box member 901. A laser diode 904 emits a laser beam $LB_0$ which is modulated according to an image signal expressing the color separated original image. The laser beam $LB_0$ is then collimated by a collimator 905, and its sectional shape is corrected to a perfect circle through an anamorphic prism pair 906.

Then, the laser beam $LB_0$ is reflected by mirrors 907 and 908, and its sectional diameter is expanded with a beam expander 909. A galvano mirror 910 oscillates periodically, thereby to convert the laser beam $LB_0$ into an oscillating laser beam LB. The laser beam LB passes through an $f\theta$ lens 911, to reach an original plate 920 held on a work table 931. The oscillation of the laser beam LB gives a main scanning on the original plate 920, while a subscanning is attained by feeding the original plate 920 in the vertical direction with a work table feeding mechanism 930, which will be described later. The photosensitive original plate 520 such as a liquid crystal panel is exposed by the laser beam LB for each scanning line, whereby a color separated image is recorded on the original plate 520.

Figure 27:
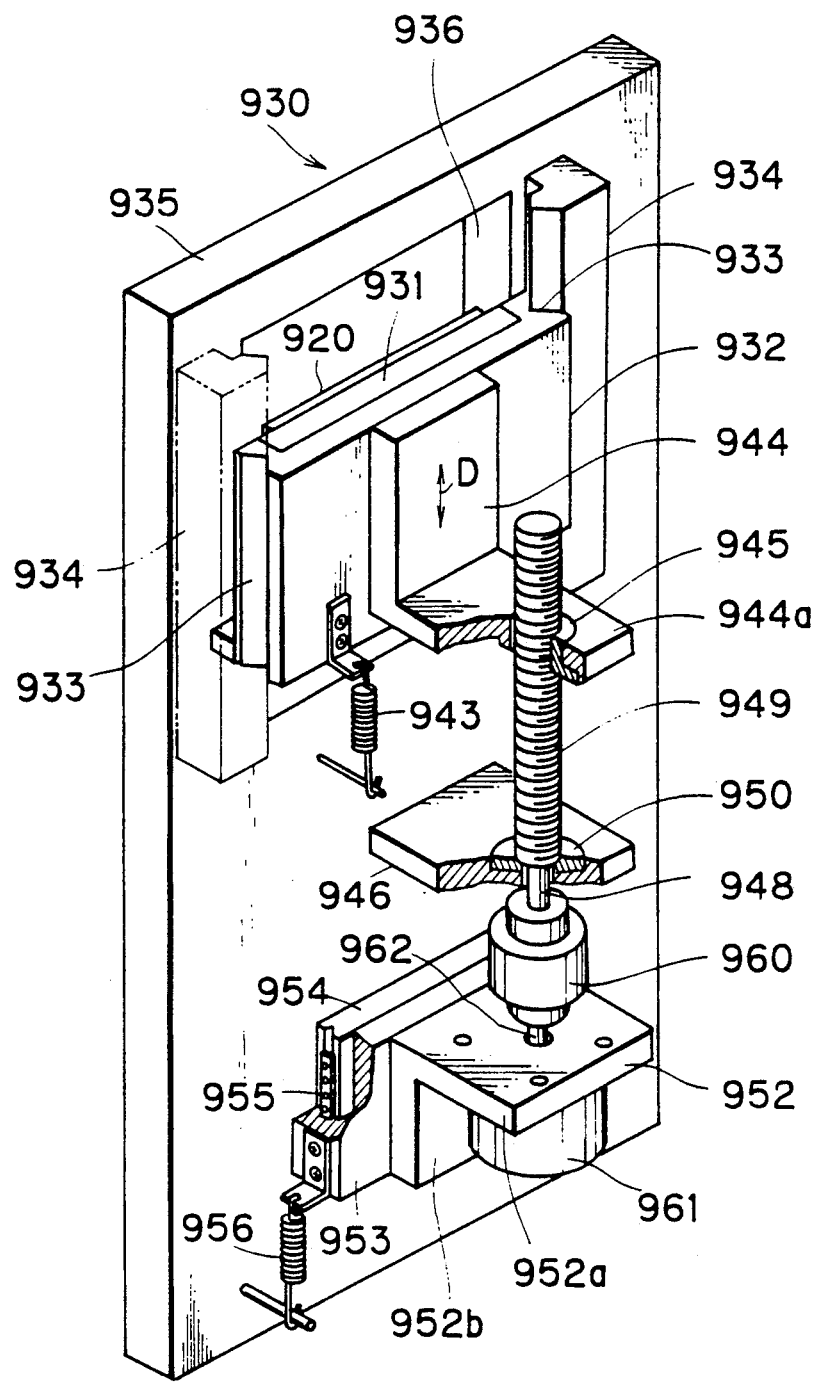
FIG. 27 is a perspective view of a work table feeder.

FIG. 27 is a perspective view of the work table feeding mechanism 930. The work table 931 is provided on a slide table 932. A pair of dovetail grooves 933 are formed in the side edges of the slide table 932. A pair of guide members 934 fitting in the dovetail grooves 933 are fixed on a base plate 935 in parallel to each other. The guide members 934 extend in the vertical direction D, and therefore, the slide table 932 can slide in the vertical direction D. A window 936 is formed in the base plate 935, through which the original plate 920 faces the rear space of the base plate 935.

Figure 28:
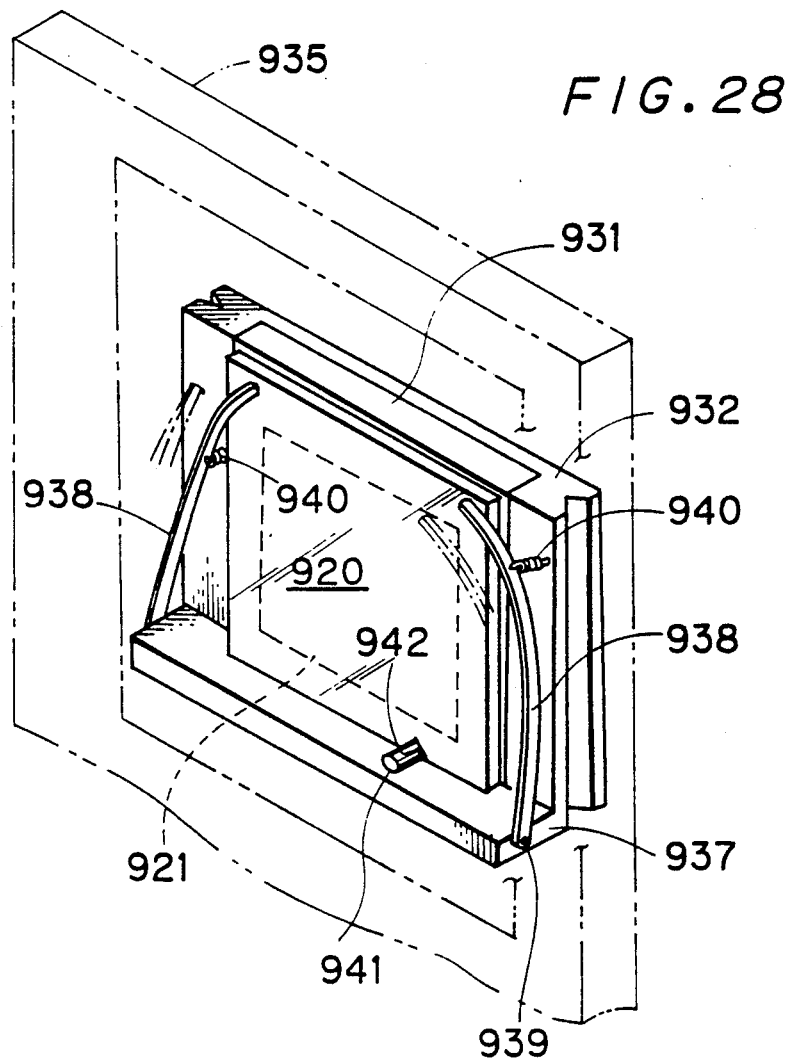
FIG. 28 is a perspective rear view of a slide table included in the work table feeder shown in FIG. 27.

FIG. 28 is a perspective rear view of the slide table 932. A step 937 is formed on the lower edge of the slide table 932, and a pair of bow members 938a are attached on the opposite sides of the step 937. Each of the bow members 938 can rotate around a pin 939 connecting the bow member 938 to the step 937. Springs 940 are provided between the bow members 938 and the slide table 932. The respective heads of the bow members 938 are manually pulled as shown by the vertical lines, and the original plate 920 is placed on the work table 931. In order to prevent the original plate 920 from being shifted in the longitudinal direction of the step 937, a bar 941 fixed on the step 937 is fitted in a groove 942 which is provided in the edge of the original plate 920. Then, the bow members 938 are released from the manual force, and the bow members 938 pushes the original plate 920 onto the work table 931 with the contractive force of the springs 940, whereby the original plate 920 is held on the work table 931. The bow members 938 are so arranged that the imaging area 921 of the original plate 920 is not hidden behind the bow members 938.

Referring to FIG. 27, a spring 943 is provided between the slide table 932 and the base plate 935, to pull the slide table 932 in the downward direction, whereby a backlash caused in driving the slide table 932 is absorbed. A hook-shaped plate member 944 is fixed on the slide table 932, and a feeding nut 945 is mounted in the horizontal portion 944a of the plate member 944.

Figure 29:
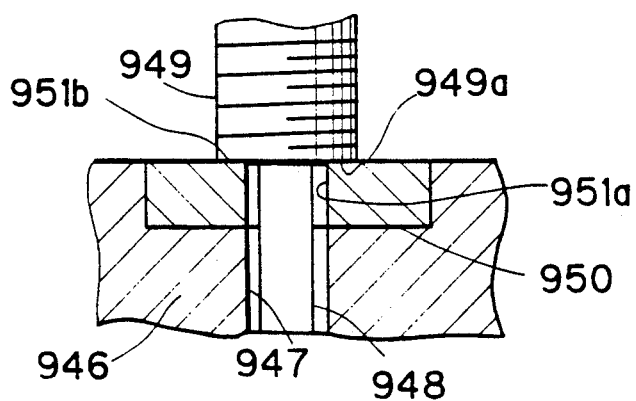
FIG. 29 is an enlarged view, partly in cross section, of a supporting mechanism for supporting a feeding screw included in the work table feeder shown in FIG. 27.

A plate member 946 is fixed on the base plate 935, in parallel to the horizontal portion 944a of the plate member 944. As shown in FIG. 29, a hole 947 is formed through the plate member 946, and a shaft 948 is inserted into the hole 947. A feeding screw 949, which is screwed into the feeding nut 945 as shown in FIG. 27, is united with the shaft 948 in coaxial with each other, the diameter of the feeding screw 949 being larger than that of the shaft 948 and the hole 947. A plane bearing 950 is so mounted in the upper surface of the plate member 946 that a hole 951a formed in the bearing 950 fits or communicates with the hole 947 in the plate member 946. The bottom edge of the feeding screw 949a is supported with the top surface 951b of the bearing 950, whereby the downward displacement of the feeding screw 949 is prevented. The diameter of the shaft 948 is smaller than that of the holes 951a and 947, so that the shaft 948 and the lower portion of the feeding screw 949 can swing in the radial direction thereof.

The bottom end of the shaft 948 is coupled to the rotor shaft 962 (FIG. 27) of the motor 961 through an universal joint 960. The motor 961 is fixed to the horizontal part 952a of a hook-shaped plate member 952. The vertical part 952b of the plate member 952 is mounted on a slide table 953. The slide table 953 can slide on a guide plate 954 in the vertical direction D, through a ball slide 955 inserted between the slide table 943 and the guide plate 954. The guide plate 954 is fixed to the base plate 935, while the slide table 953 is pulled in the downward direction by a spring 956 provided between the slide table 953 and the base plate 935. The pulling force by the spring 956 is transmitted to the feeding screw 949, whereby the bottom surface 949a (FIG. 29) always contacts the bearing 950. In the case where the longitudinal direction of the feeding screw 946 is the vertical direction D as shown in FIG. 27, the springs 956 and 943 may be omitted, since the specific gravity of the elements 931, 932 and 944 absorbs the backlash in the coupling of the feeding screw 949 and the feeding nut 945, and the specific gravity of the elements 948–953 functions as a force for making the feeding screw 949 contact the bearing 950.

When the motor 961 is intermittently supplied with an electric power, the rotor shaft 962 rotates, whereby the shaft 948 and the feeding screw 949 rotate intermittently around their common axis. The feeding nut 945 moves in the direction D in response to the rotation of the feeding screw 949, so that the original plate 920 is intermittently moved or fed in the vertical direction D together with the elements 931, 932 and 944. As described above, the subscanning in the exposure process of the original plate 920 is attained through the movement or feed of the original plate 920. The repetition period of the intermittent supply of the electric power is set at the time period in which one main scanning is achieved.

During the original plate 520 is fed in the direction D, the motor 961 vibrates because of the rotation of the rotor provided therein. The vibration has two components, one of which is that in the vertical direction D, i.e., longitudinal direction of the feeding screw 949, and the other is that in the horizontal direction. The vertical component is absorbed by the slide mechanism for sliding the slide table 953, while the horizontal component is absorbed by the universal joint 960 and the structure where the shaft 948 is swingable in the hole 947 in the horizontal direction or the radial direction. Therefore, the feed of the original plate 920 can be attained at a high accuracy without the vibration transmitted from the motor 961. Especially, the absorption of the vertical vibration is most characteristic in the present mechanism. If such a mechanism is not employed, the feeding pitch of the original plate 920 has large error, so that the image recorded on the original plate 920 is reduced in quality. The construction of the present mechanism for absorbing both of the vibration components is quite effective in the feeding process in which a high accuracy is required.

Figure 30:
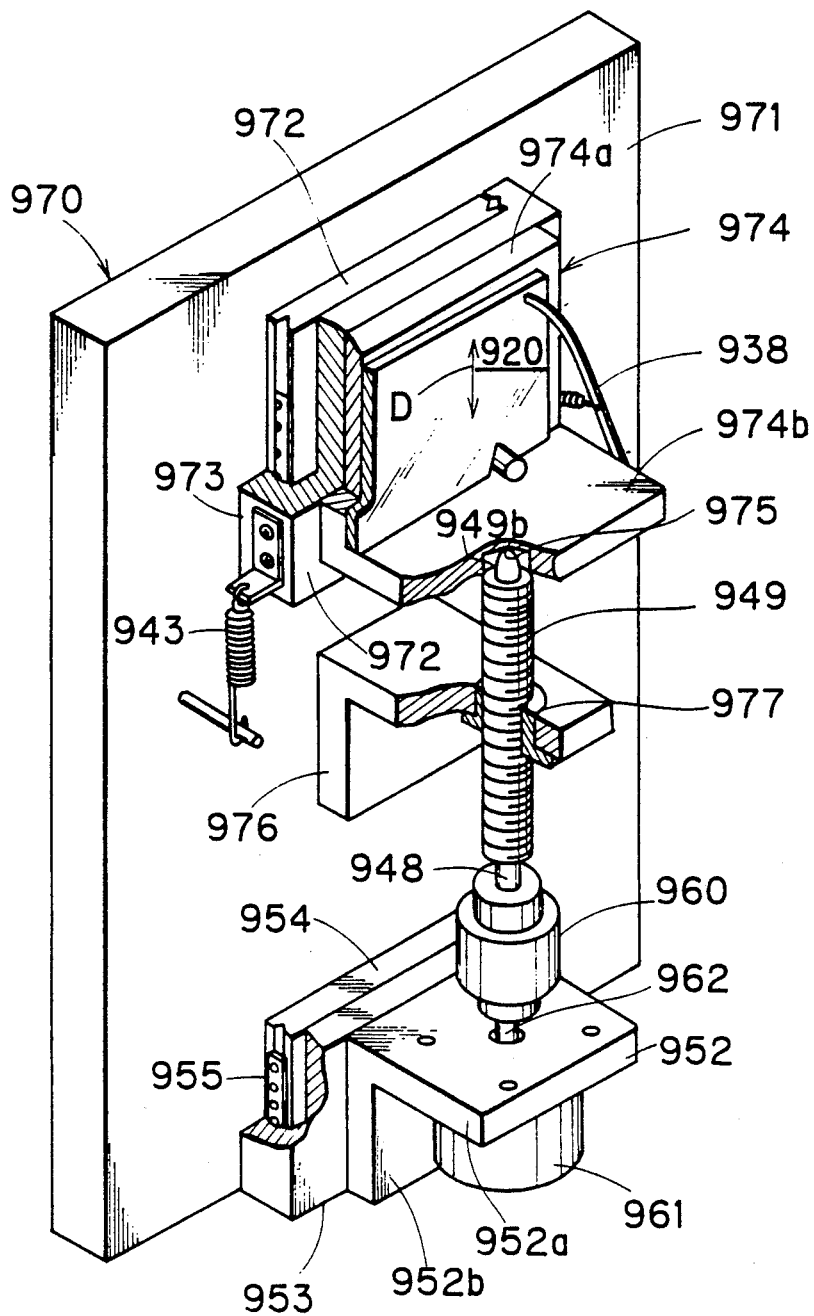
FIG. 30 is a perspective view of another example of the work table feeder.

FIG. 30 shows another example of a work table feeding mechanism 970. In the mechanism 970, the same elements with the feeding mechanism 930 shown in FIG. 27 are provided with the same reference numerals. The mechanism 970 has a base plate 971 on which a guide plate 972 is fixed. A slide table 973 is so provided on the guide plate 972 as to slide on the guide plate 972 in the vertical direction D. A hook-shaped work table 974 is fixed to the slide table 973, and the original plate 920 is placed on the vertical part 974a of the work table 974 while being held with the bow members 938 (one of the bow members 938 is not shown in FIG. 30).

The work table 974 has a horizontal part 974b, and a concavity 975 is formed in the lower surface of the horizontal part 974b. A hook-shaped plate 976 is fixed on the base plate 971, and a feeding nut 977 is mounted therein. The feeding screw 949 extending in the vertical direction D is screwed into the nut 977. The top end of the screw 949 is shaped into a convexity 949b, which is inserted in the concavity 975 to contact the bottom of the concavity 975. The diameter of the concavity 975 is larger than that of the convexity 949b, whereby the upper part of the feeding screw 949 can swing in the radial direction thereof. The other structure is the same with the mechanism 930 shown in FIG. 27, except that the spring 956 is not provided in the mechanism 970. The feeding mechanism 970 is so inserted in the exposure unit 9 (FIG. 26) that the original plate 920 faces the fθ lens 911, and therefore, no window is provided in the base plate 971.

When the motor 961 rotates intermittently, the feeding screw 949 is moved in the direction D, because of the coupling of the feeding screw 949 and the nut 977. The motor 961 also moves in the direction D with the slide coupling of the motor 961 with the base plate 971. In response to the movement of the feeding screw 949, the work table 974 holding the original plate 920 is intermittently moved in the direction D, since the convexity 949b is raised or lowered. The movement of the original plate 920 gives the subscanning in the laser exposure.

In the feeding mechanism 970, the horizontal component of the motor vibration is absorbed by the universal joint 948 and the loose coupling of the convexity 949b with the concavity 975, while the vertical component of the motor vibration is absorbed by the slide coupling of the motor 961 with the base plate 971. Therefore, the accuracy in feeding the work tabe 974 is improved similarly to the feeding mechanism 930. When the feeding pitch of the original plate 920 is set at 17 μm in the intermittent feeding, the feeding error per one pitch is about ±0.3 μm in both of the present mechanisms 930 and 970. This error is considerably smaller than the feeding error of ±0.8 μm in a mechanism having no slide coupling of the motor and the base plate. The feeding mechanism according to the present invention can be also employed in various apparatuses in which accurate feeding of a work tabe is required.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A recorder for recording a color image, said recorder comprising:
   A) a photosensitive sheet feeder for feeding a photosensitive sheet in a downstream direction;
   B) a stage for receiving said photosensitive sheet thereon;
   C) a projector for simultaneously projecting a plurality of color separated image lights onto a common area of said photosensitive sheet when said photosensitive sheet is received on said stage to expose and photoharden microcapsules distributed on a surface of said photosensitive sheet, said microcapsules including groups of different color dyes; said projector including:
      1) a generator for generating colored lights;
      2) an original holder for holding original plates on which color separated images are recorded and for forming said color separated image lights when said colored lights from said generator pass through said original plates, said original holder being located between said generator and said stage; and
      3) a lens unit located between said original holder and said stage, said lens unit including projection lenses for projecting said color separated image lights onto said common area of said photosensitive sheet;
   D) a receiver paper feeder for feeding a receiver paper onto said photosensitive sheet so that said receiver paper contacts said microcapsules, said receiver paper feeder being downstream from said stage;
   E) a press for pressing said receiver paper and said photosensitive sheet toward each other to destroy microcapsules which are not photohardened so that dyes from said destroyed microcapsules form a color image on said receiver paper, said press being downstream from said receiver paper feeder; and
   F) separating means for separating said receiver paper from said photosensitive sheet.

2. The recorder of claim 1, wherein said receiver paper includes an active surface layer, said active surface layer including a color coupler for coupling with said dyes from said destroyed microcapsules form said color image.

3. The recorder of claim 1, wherein:
   said stage is adapted to receive said photosensitive sheet with a gap between said photosensitive sheet and said stage; and
   said stage includes suction generating means for generating suction within said gap to draw said photosensitive sheet toward said stage.

4. The recorder of claim 3, wherein said stage includes holes for drawing air away from said gap to generate said suction.

5. The recorder of claim 1, wherein said original plates and said lenses are arranged so that an off-axis projection condition is satisfied by each of said lenses, said off-axis projection condition being a condition wherein a line connecting a center point of one of said original plates and a center point of said common area of said photosensitive sheet crosses the optical axis of the corresponding one of said lenses within said corresponding lens.

6. The recorder of claim 5, wherein said lens unit includes: a first block member and a first projection lens mounted within said first block member; and a second block member and a second projection lens mounted within said second block member by a rotatable eccentric ring, said second block member being interconnected to said first block member so that the optical axes of said first and second projection lenses are parallel to each other, said second block member being movable in a direction which is perpendicular to said optical axes.

7. The recorder of claim 1, further comprising:
   a puncher for punching a hole in said photosensitive sheet when said photosensitive sheet is exposed by said color separated image lights;
   hole detecting means for detecting said hole, said detecting means being located between said puncher and said receiver paper feeder;
   stopping means for stopping said receiver paper after said receiver paper has been fed onto said photosensitive sheet; and
   releasing means for releasing said receiver paper from said stopping means when said hole is detected by said hole detecting means and for feeding said receiver paper and said photosensitive sheet to said press.

8. The recorder of claim 1, further comprising:
   loading means for loading said photosensitive sheet onto said stage, said loading means being downstream from said photosensitive sheet feeder; and
   unloading means for unloading said photosensitive sheet from said stage, said unloading means being downstream from said stage.

9. The recorder of claim 8, wherein:
   said photosensitive sheet includes a continuous long sheet on a roll; and
   said photosensitive sheet feeder includes unrolling means for unrolling said roll and for intermittently feeding an unrolled part of said sheet to said stage.

10. The recorder of claim 9, wherein:
    said loading means includes a loading roller located between said photosensitive sheet feeder and said stage for loading said photosensitive sheet onto said stage;
    said unloading means includes an unloading roller located downstream from said stage for unloading said photosensitive sheet from said stage;
    said loading and unloading means include means for rotating said rollers so that the circumference of said unloading roller travels faster than the circumference of said loading roller; and
    said rollers are adapted to support said photosensitive sheet above said stage so that said photosensitive sheet floats on said stage when said rollers are rotated.

11. The recorder of claim 10, further comprising:

first buffering means for buffering tension applied to said photosensitive sheet, said first buffering means being located between said photosensitive sheet feeder and said loading means; and second buffering means for buffering tension applied to said photosensitive sheet, said second buffering means being downstream from said unloading means.

12. A recorder for recording a color image, said recorder comprising:
A) a photosensitive sheet feeder for feeding a photosensitive sheet in the downstream direction;
B) a stage for receiving said photosensitive sheet thereon, said stage being adapted to receive said photosensitive sheet with a gap between said photosensitive sheet and said stage, said stage including suction generating means for generating suction within said gap to draw said photosensitive sheet toward said stage;
C) a projector for simultaneously projecting a plurality of color separated image lights onto a common area of said photosensitive sheet when said photosensitive sheet is received on said stage to expose and photoharden microcapsules distributed on a surface of said photosensitive sheet, said microcapsules including groups of different color dyes;
D) a receiver paper feeder for feeding a receiver paper onto said photosensitive sheet so that said receiver paper contacts said microcapsules, said receiver paper feeder being downstream from said stage;
E) a press for pressing said receiver paper and said photosensitive sheet toward each other to destory microcapsules which are not photohardened so that dyes from said destroyed microcapsules form a color image on said receiver paper, said press being downstream from said receiver paper feeder; and
F) separating means for separating said receiver paper from said photosensitive sheet.

13. The recorder of claim 12, wherein said stage includes holes for drawing air away from said gap to generate said suction.

14. A recorder for recording a color image, said recorder comprising:
A) a photosensitive sheet feeder for feeding a photosensitive sheet in a downstream direction;
B) a stage for receiving said photosensitive sheet thereon;
C) a projector for simultaneously projecting a plurality of color separated image lights onto a common area of said photosensitive sheet when said photosensitive sheet is received on said stage to expose and photoharden microcapsules distributed on a surface of said photosensitive sheet, said microcapsules including groups of different color dyes;
D) a receiver paper feeder for feeding a receiver paper onto said photosensitive sheet so that said receiver paper contacts said microcapsules, said receiver paper feeder being downstream from said stage;
E) a press for pressing said receiver paper and said photosensitive sheet toward each other to destroy microcapsules which are not photohardened so that dyes from said destroyed microcapsules form a color image on said receiver paper, said press being downstream from said receiver paper feeder;
F) separating means for separating said receiver paper from said photosensitive sheet;
G) a puncher for punching a hole in said photosensitive sheet when said photosensitive sheet is exposed by said color separated image lights;
H) hole detecting means for detecting said hole, said detecting means being located between said puncher and said receiver paper feeder;
I) stopping means for stopping said receiver paper after said receiver paper has been fed onto said photosensitive sheet; and
J) releasing means for releasing said receiver paper from said stopping means when said hole is detected by said hole detecting means and for feeding said receiving paper and said photosensitive sheet to said press.

* * * * *